(12) United States Patent
Huang et al.

(10) Patent No.: US 6,785,655 B1
(45) Date of Patent: *Aug. 31, 2004

(54) METHOD FOR INDEPENDENT DYNAMIC RANGE CONTROL

(75) Inventors: Wen Huang, Sunnyvale, CA (US);
Winnie K. W. Lau, San Jose, CA (US);
Brendan J. Mullane, Tokyo (JP)

(73) Assignee: LSI Logic Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/571,399

(22) Filed: May 15, 2000

(51) Int. Cl.[7] .......................... G10L 19/00; G10L 19/14
(52) U.S. Cl. ...................... 704/500; 704/501; 704/224; 704/230
(58) Field of Search ................................ 704/230, 500, 704/224, 200.1, 501

(56) References Cited

U.S. PATENT DOCUMENTS 5,633,981 A    5/1997   Davis ........................ 395/2.39

OTHER PUBLICATIONS

Huang, Wen et al. Method for Independent Dynamic Range Control. patent application 09/571691.*
Digital Audio Compression Standard (AC–3), *Advanced Television Systems Committee* (1995).
Chapter 6 Instruction Set, *Functional Specification Copyright © by LSI Logic Corporation* (1997).

* cited by examiner

*Primary Examiner*—Minsun Oh Harvey
*Assistant Examiner*—Devona E Faulk
(74) *Attorney, Agent, or Firm*—Sawyer Law Group

(57) ABSTRACT

Different dynamic range control values are applied to the 2-channel and m-channel outputs without repeating the inverse transform or the windowing of the audio samples. First, m-channel dynamic range control values are applied to audio samples in the frequency domain ("frequency samples" or "frequency coefficients"). The frequency samples are then inverse transformed to generate audio samples in the time domain ("time samples") and windowed to generate windowed time samples. The windowed time samples are saved and the 2-channel dynamic range control values are applied to the windowed time samples. 2-channel dynamic range control values include 2-channel scale factors that, when multiplied with groups of the windowed time samples, at least partially remove the effects of windowing and the m-ch dynamic range control values applied in the frequency domain and readjust the dynamic range for 2-channel output. Thus, a set of windowed time samples under m-channel dynamic range control values and a set of windowed time samples under 2-channel dynamic range control values are generated without repeating the inverse transform or the windowing, which are computational and/or memory intensive.

34 Claims, 11 Drawing Sheets

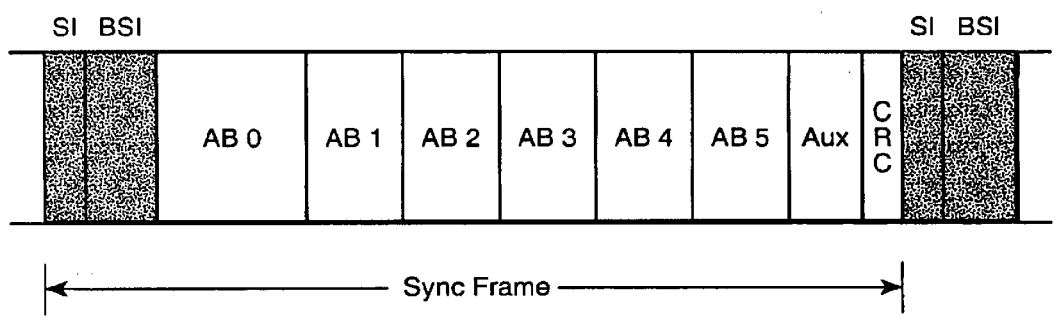
FIG._1A *(PRIOR ART)*

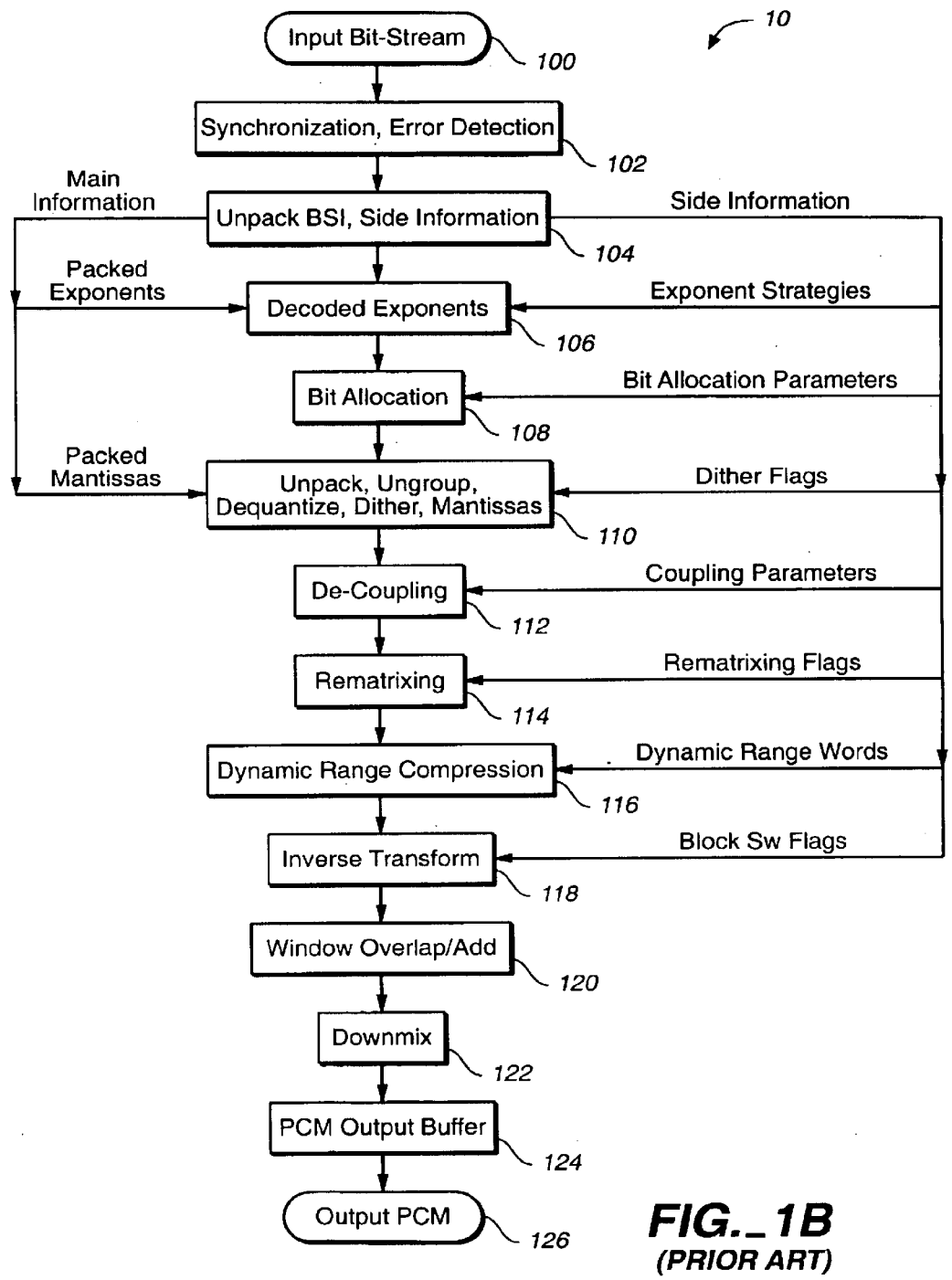
FIG._1B
*(PRIOR ART)*

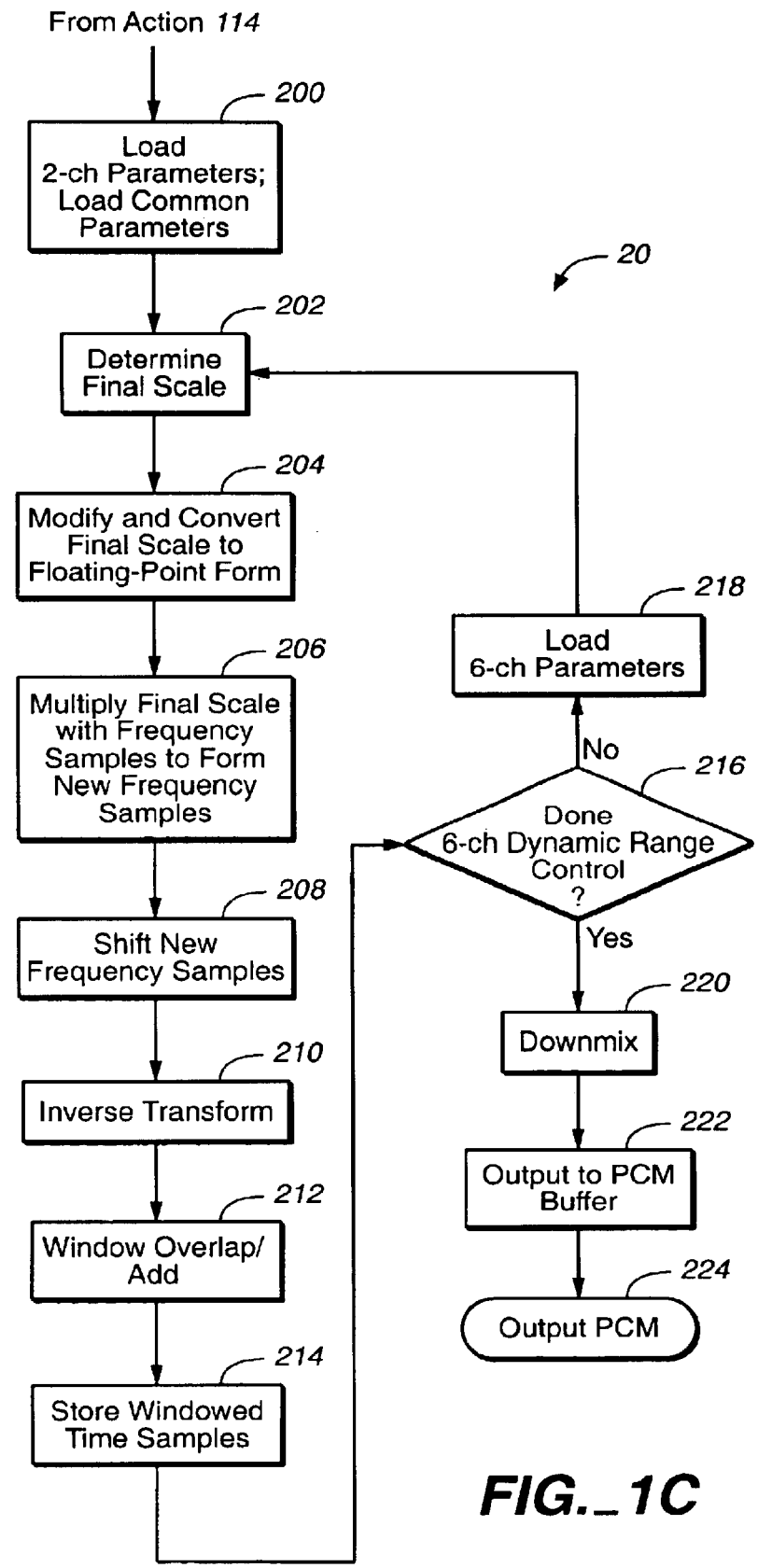
FIG._1C

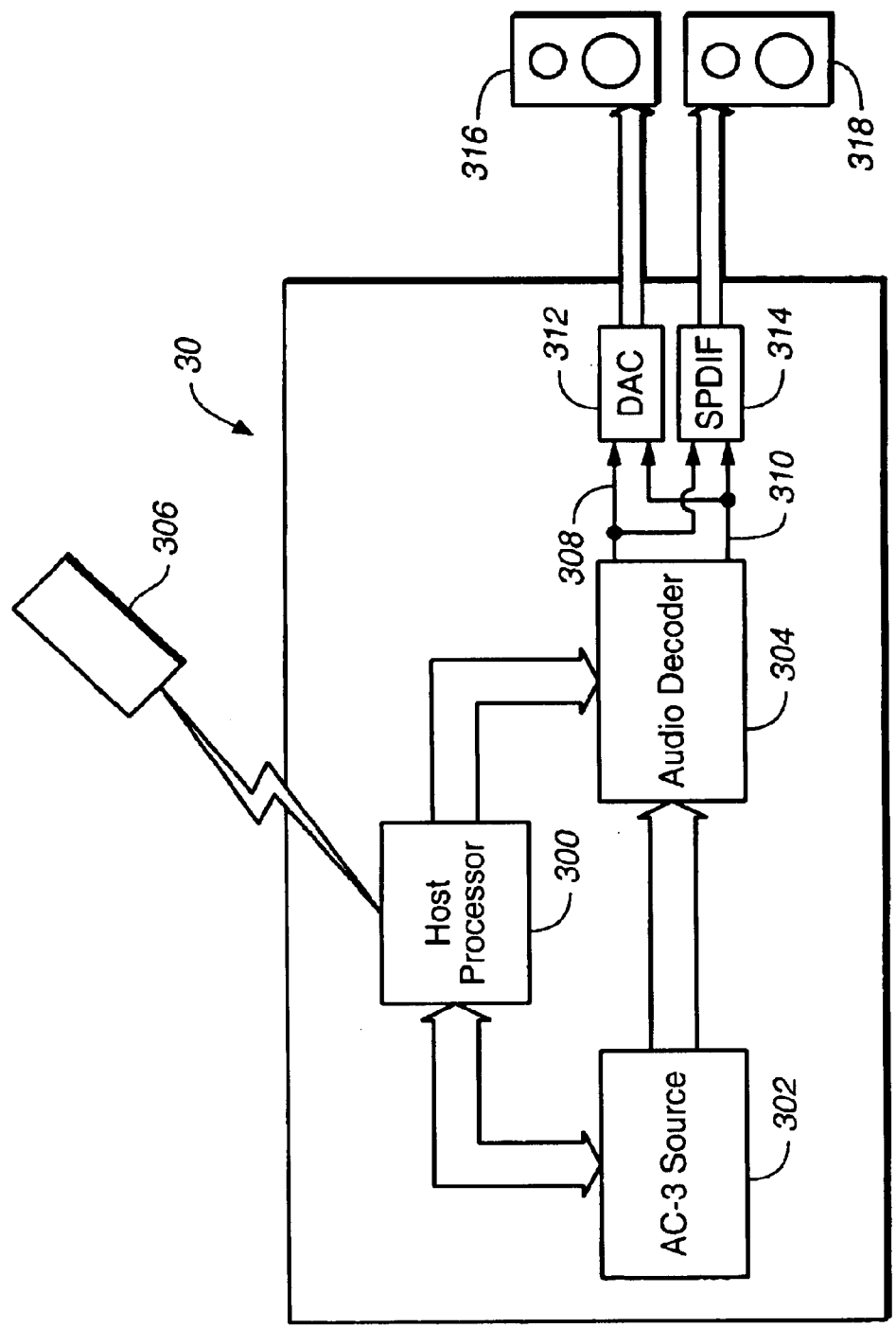
FIG._2

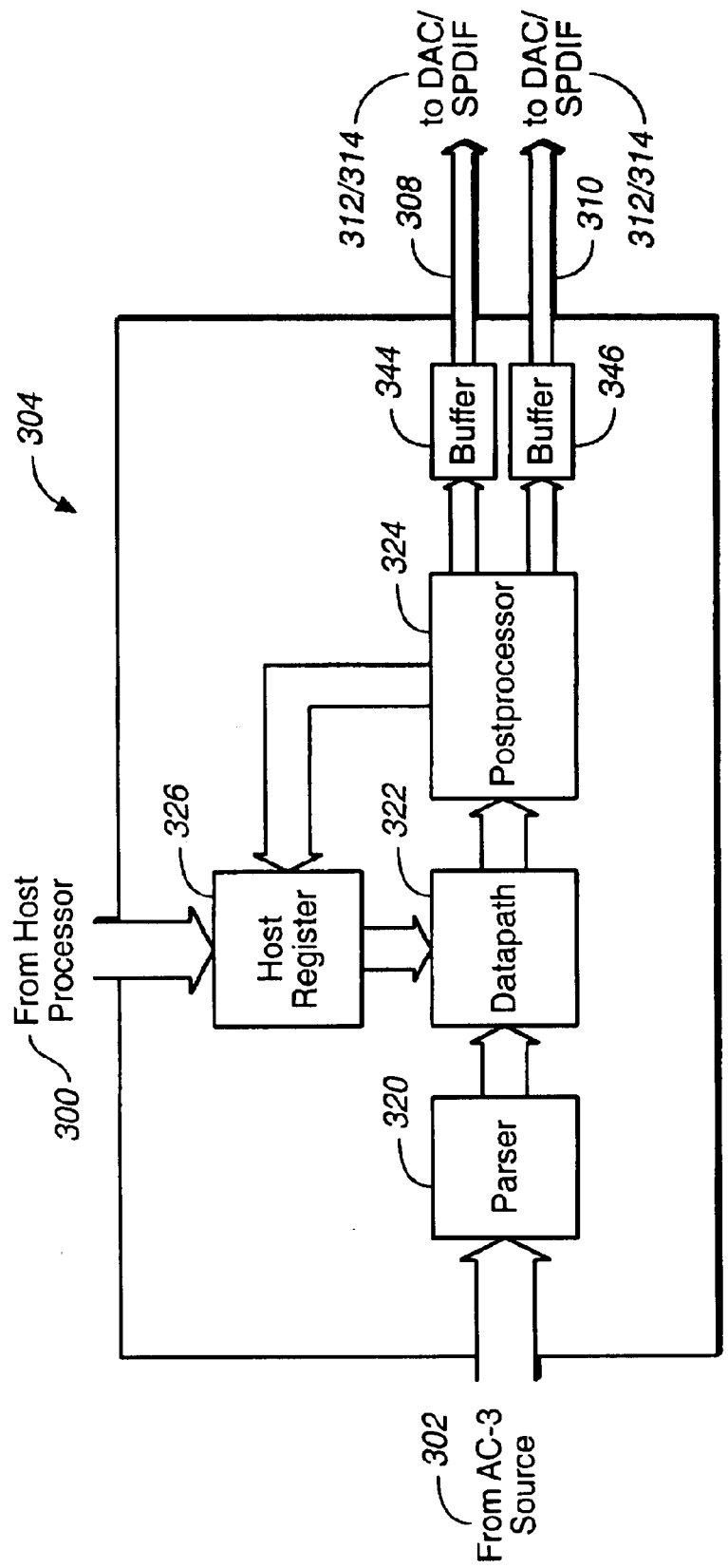
FIG._3

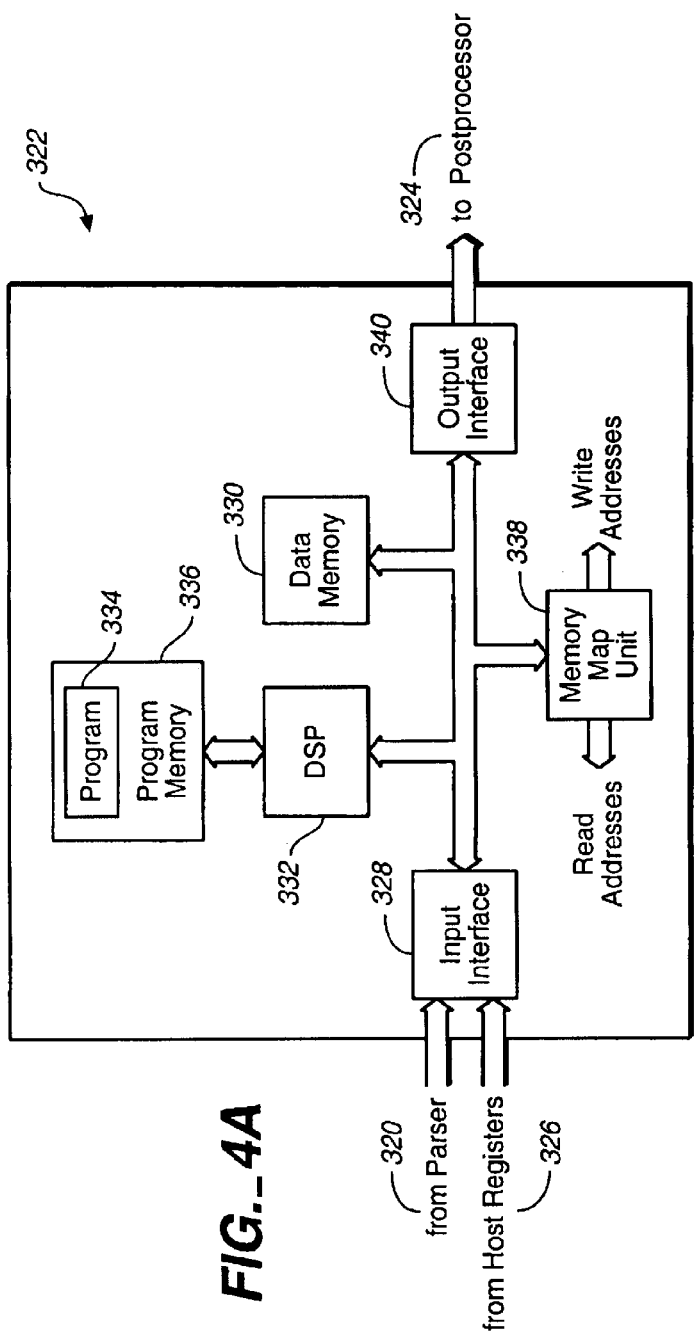
FIG._4A
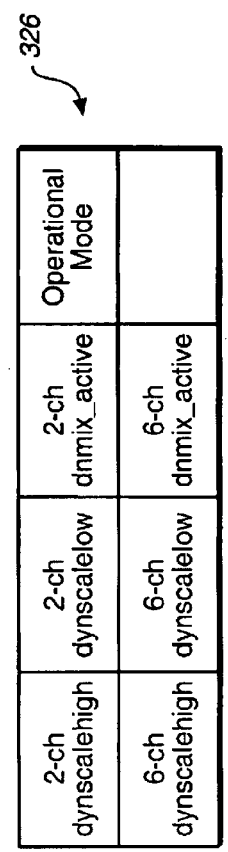
FIG._4B

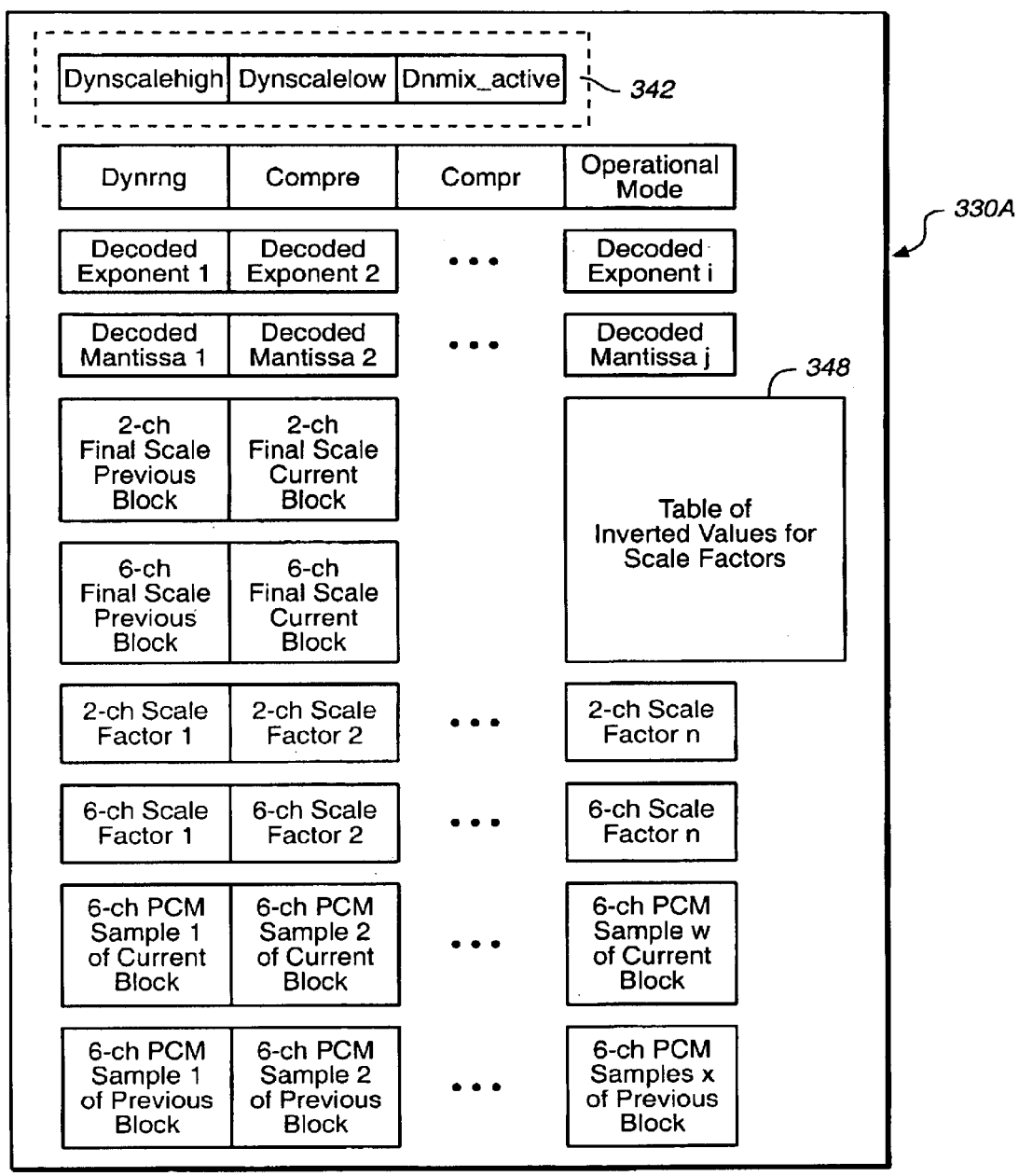
FIG._4C

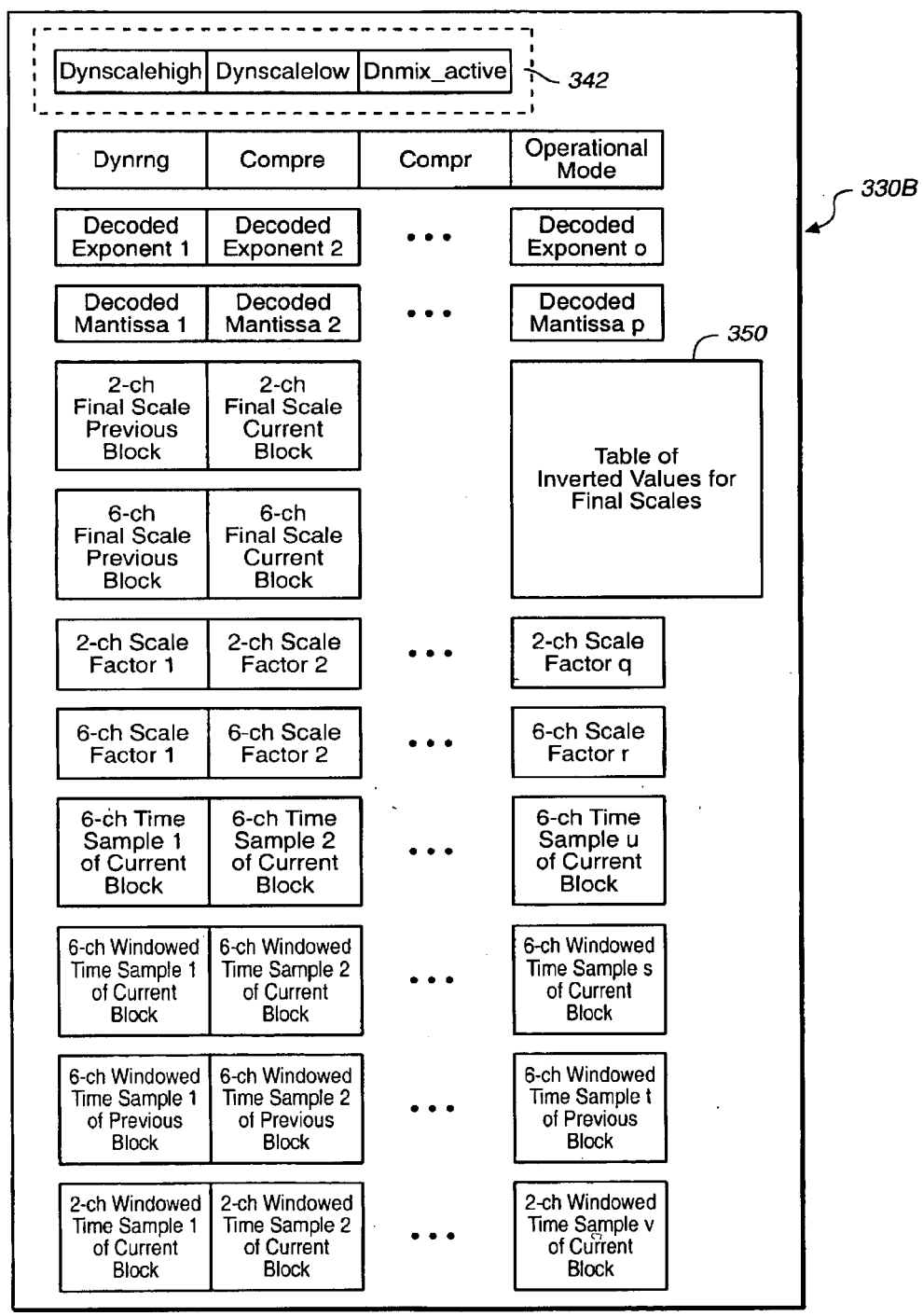
FIG._4D

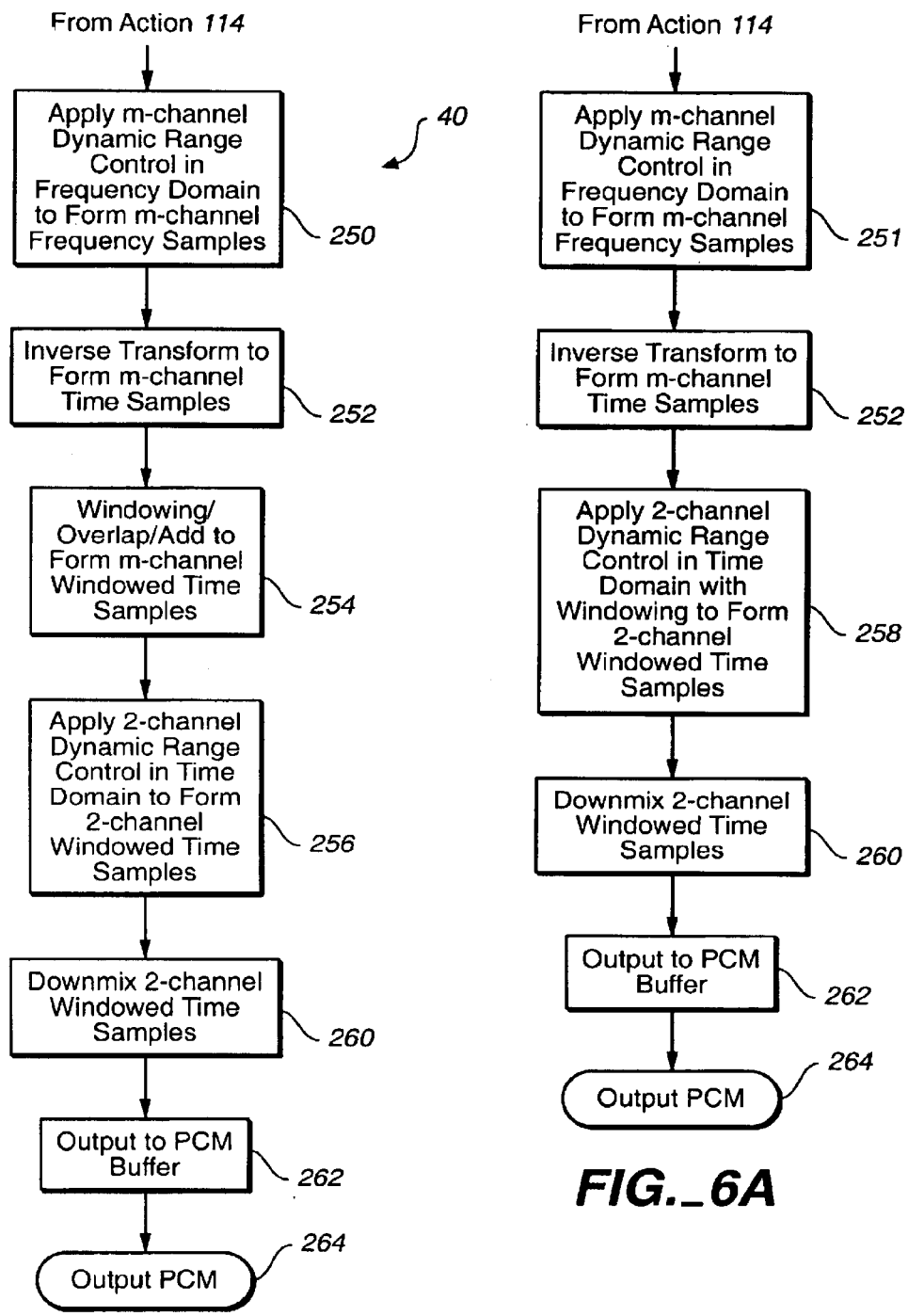
FIG._5A  FIG._6A

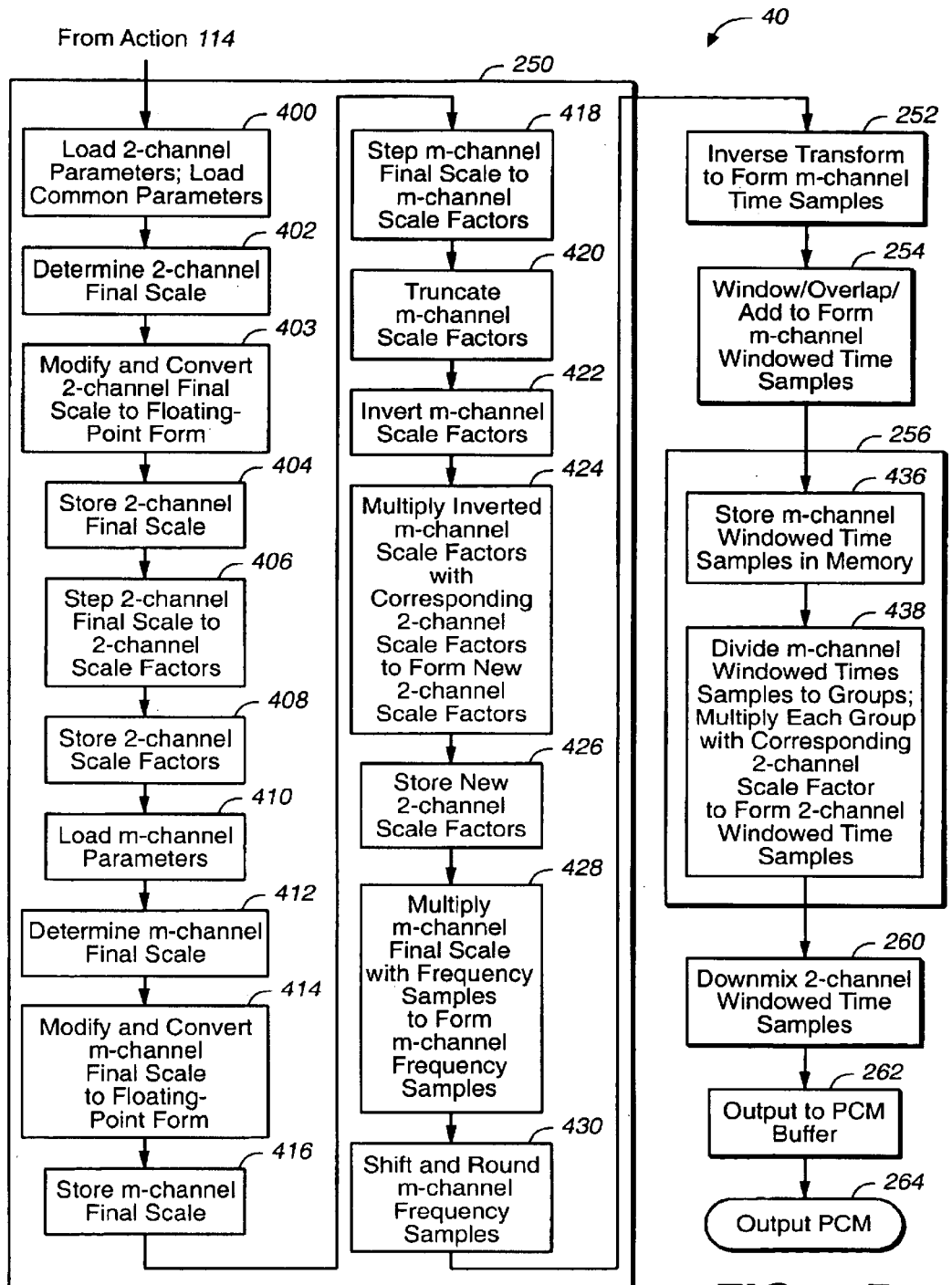
FIG._5B

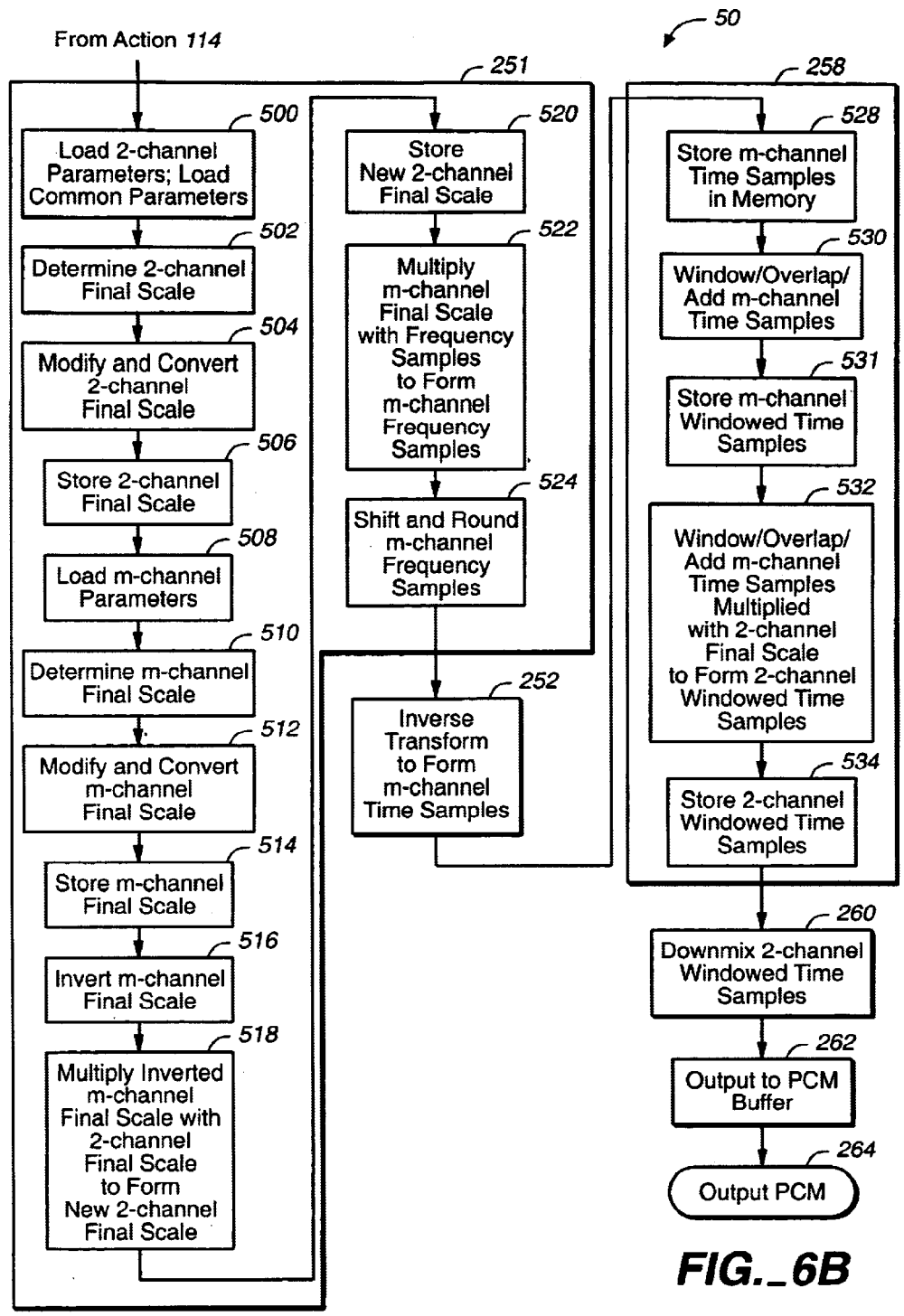
FIG._6B

METHOD FOR INDEPENDENT DYNAMIC RANGE CONTROL

CROSS-REFERENCE TO SOURCE CODE APPENDIX

Appendix A, which is part of the present disclosure, contains assembly code for a digital signal processor for implementing one embodiment of this invention as described more completely below.

A portion of the present disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

BACKGROUND

Active Coding-3, also known as "AC-3" or "Dolby Digital," is a digital audio standard described in "Digital Audio Compression (AC-3)" by the United States Advanced Television Systems Committee, which is hereby incorporated by reference in its entirety.

A prior art AC-3 bitstream is illustrated in FIG. 1A, which is reproduced from FIG. 5.1 of "Digital Audio Compression (AC-3)" referenced above. The AC-3 bitstream is made up of a sequence of synchronization frames. Each synchronization frame contains 6 coded audio blocks ("AB"), each of which represents 256 new audio samples. A synchronization information ("SI") header at the beginning of each frame contains information needed to acquire and maintain synchronization. A bitstream information ("BSI") header follows the SI header, and contains parameters describing the coded audio service. An auxiliary data ("AUX") field may follow the coded audio blocks. At the end of each frame is an error check field that includes a cyclical redundancy check ("CRC") word for error detection. An optional CRC word is also located in the SI header.

AC-3 provides a dynamic range control system that allows program providers, such as movie studios, to control the dynamic range of their audio programs. Dynamic range refers to the range of the relative sound levels in an audio program. For example, dialogues are usually used as a reference where loud sounds are certain decibels above the dialogue sound level while soft sounds are certain decibels below the dialogue sound level.

Program providers can encode dynamic range gain words ("dynrng") (e.g., 8 bits) in the audio blocks to alter the gain of the audio blocks. The dynrng values typically indicate decibel ("dB") gain reduction during the loudest signal passages, and dB gain increases during the quite passages. AC-3 provides that AC-3 decoders shall implement the compression characteristics indicated by the dytrng values encoded in the audio blocks. AC-3 further provides that AC-3 decoders may optionally allow listener control over the use of the dynrng values so that the listener may select full dynamic range reproduction by ignoring the dynrng values or partial dynamic range reproduction by using some fraction of the dynrng values.

Program providers can also encode compression gain words ("compr") (e.g., 8 bits) in the BI header to alter the gain of the audio frames. The compr values provide larger dynamic range reductions (also known as "heavy compression") than the dynrng values. The compr values have twice the control range as the dynrng values (±48 dB vs. ±24 dB) with half the resolution (0.5 dB v. 0.25 dB).

AC-3 decoders may provide both 2-channel and m-channel outputs (m>0; e.g., m=6). In some applications, consumers may desire independent dynamic range control for the 2-channel and the m-channel outputs. To provide independent dynamic range control for the 2-channel and the m-channel outputs, AC-3 decoders can (1) execute the decoding algorithm with one set of dynamic range gain words (or compression gain words) for the 2-channel output, and (2) execute the decoding algorithm again with another set of dynamic range gain words (or compression gain words) for the m-channel output. This method is inefficient because actions that are computational and/or memory intensive are repeated. Thus, what is needed is a method that provides independent dynamic range control for 2-channel and m-channel outputs while minimizing the repetition of computational and/or memory intensive actions.

SUMMARY

In accordance with one aspect of the invention, independent dynamic range control are provided for 2-channel and m-channel outputs without repeating computational and/or memory intensive actions including the inverse transform and the windowing of audio samples.

In one embodiment, m-channel dynamic range control is conventionally applied to the m-channel audio samples in the frequency domain to form m-channel frequency samples. The m-channel frequency samples are inverse transformed to generate audio samples in the time domain ("m-channel time samples") and windowed to generate windowed time samples (i.e., the m-channel output).

2-channel dynamic range control is applied to the m-channel audio samples in the time domain after windowing instead of the m-channel audio samples in the frequency domain prior to the inverse transform, thereby avoiding repeating the inverse transform and the windowing of the m-channel audio samples. To do this, the m-channel output is divided into groups and each group is multiplied with a corresponding 2-channel dynamic range scale factor. The 2-channel dynamic range scale factors at least partially remove the effects of the m-channel dynamic range control applied in the frequency domain and the windowing in the time domain, and readjust the dynamic range of the m-channel output for 2-channel output. These audio samples are then downmixed to form the 2-channel output.

In another embodiment, the 2-channel and m-channel outputs are generated without repeating the inverse transform. The m-channel dynamic range control is conventionally applied to the m-channel frequency samples. The m-channel frequency samples are inverse transformed to generate the m-channel time samples.

The m-channel time samples are duplicated to two sets. In the first set, the m-channel time samples are conventionally windowed to generate windowed time samples (i.e., the m-channel output). In the second set, a 2-channel dynamic range final scale is multiplied with the m-channel time samples. The 2-channel final scale at least partially removes the effects of the m-channel dynamic range control applied in the frequency domain and readjusts dynamic range of the m-channel time samples for 2-channel output. The second set is then windowed to generate windowed time samples and downmixed to form the 2-channel output.

BRIEF DESCRIPTION OF THE DRAWINGS

FIG. 1A illustrates a prior art AC-3 bitstream.

FIG. 1B illustrates, in a flow chart, a method for decoding AC-3 bitstreams.

FIG. 1C illustrates, in a flow chart, a method for independently controlling the dynamic range of the 2-channel output and the m-channel output.

FIG. 2 illustrates, in a block diagram, a host device.

FIG. 3 illustrates, in a block diagram, an audio decoder of FIG. 2.

FIG. 4A illustrates, in a block diagram, a datapath device of FIG. 3.

FIG. 4B illustrates, in a block diagram, a host register of FIG. 3.

FIGS. 4C and 4D illustrate, in block diagrams, embodiments of a data memory of FIG. 4A.

FIGS. 5A and 5B illustrate, in flow charts, a method for independently controlling the dynamic range of the 2-channel output and the m-channel output in accordance with one aspect of the present invention.

FIGS. 6A and 6B illustrate, in flow charts, another method for independently controlling the dynamic range control of the 2-channel output and the m-channel output in accordance with another aspect of the present invention.

DETAILED DESCRIPTION

FIG. 1B illustrates an AC-3 decoding method 10, which is reproduced from FIG. 6.1 of "Digital Audio Compression (AC-3)" referenced above. In action 100, the input bitstream is received. Action 100 is followed by action 102. In action 102, the bitstream is synchronized and checked for errors. Action 102 is followed by action 104. In action 104, bitstream information ("BSI"), main information, and side information are unpacked. The side information includes exponent strategies, bit allocation parameters, dither flags, coupling parameters, rematrixing flags, dynamic range words (e.g., dynrng and compr), and block switch flags. The main information includes the packed (encoded) exponents and mantissas. Action 104 is followed by action 106.

In action 106, the exponents for audio samples are unpacked and decoded. Please note that the audio samples are encoded in the AC-3 bitstream as frequency samples (also known as "frequency coefficients") represented in floating point format (composing of exponents and mantissas). Please further note that exponent strategies, the number of exponents, and the actual packed exponents are employed to decode the exponents in action 106. Action 106 is followed by action 108. In action 108, the decoded exponents and bit allocation parameters are used to determine a set of bit allocation pointers ("baps"), one for each coded mantissa. The baps indicate the quantizer used for the mantissa and how many bits in the bitstream were used for each mantissa. Action 108 is followed by action 110.

In action 110, the mantissas are unpacked, ungrouped, dequanitzed, and/or dithered. The mantissas are unpacked by peeling off groups of bits as indicated by the baps. Grouped mantissas must be ungrouped. Individual coded mantissa values are converted into a dequantized value. Mantissas that are indicated as having zero bits are reproduced as either zero or by a random dither value (under the control of the dither flag). Action 110 is followed by action 112. In action 112, the channels that are coupled must be decoupled according to the coupling parameters. Action 112 is followed by action 114. In action 114, rematrixing is employed in response to the rematrixing flag. Action 114 is followed by action 116.

In action 116, the magnitudes of the exponents and the mantissas are altered according to the dynamic range words. Dynamic range words include dynrng and compr. Action 116 is followed by action 118. In action 118, blocks of frequency samples are inverse transformed into blocks of time samples. Inverse transform is conducted in one of two modes: a 512-sample transform and 256-sample transform. A block switch flag specifies which of these two formats is to be employed on the incoming block. Action 118 is followed by action 120.

In action 120, individual blocks of time samples are windowed and adjacent blocks of time samples are overlapped and added together to reconstruct the final continues time output PCM audio signal. Action 120 is followed by action 122. In some applications, two sets of outputs are provided. One set of output has output channels equal to the input channels while another set of output has downmixed output channels less than the input channels. In action 122, the transmitted channels are downmixed to the output channels if the former is greater than the latter. Action 122 is followed by action 124. In action 124, the actual PCM values are provided to an output buffer. Action 124 is followed by action 126. In action 126, the actual PCM values are output. Implementations of method 10, commonly known to one skilled in the art as Dolby Reference Code, may be licensed from Dolby Laboratories, Inc. of San Francisco, Calif.

FIG. 1C illustrates a method 20 that provides 2-channel and m-channel outputs (m>0; e.g., m=6) with independent dynamic range control. Method 20 employs the previously described actions 100, 102, 104, 106, 108, 110, 112, and 114 of FIG. 1B. Action 114 is followed by action 200.

In action 200, parameters used only to adjust the dynamic range of the 2-channel output ("2-ch parameters") are loaded. The 2-ch parameters include parameter 2-channel scale high ("2-ch dynscalehigh") (e.g., 8 bits), parameter 2-channel scale low ("2-ch dynscalelow") (e.g., 8 bits), and parameter 2-channel downmix active ("2-ch dnmix_active") (e.g., 1 bit). Other parameters used to adjust the dynamic range of both the 2-channel output and the m-channel output ("common parameters") are also loaded. The common parameters include the dynamic range gain word ("dynrng") (e.g., 8 bits) for the current block, the compression gain word exist bit ("compre") (e.g., 1 bit) for the current frame, the compression gain word ("compr") (e.g., 8 bits) for the current frame, the operational mode (also known as "compression mode") (e.g., 2 bits), and the mantissas (e.g., 24 bits) and exponents (e.g., 6 bits) of the frequency samples of the current block.

Parameters 2-ch dynscalehigh and 2-ch dynscalelow are used to scale parameter dynrng to produce partial dynamic range reproduction. Parameter 2-ch dnmix_active is determined according to the Dolby® downmix algorithm applied in action 220 (described later) to downmix the input channels to 2 output channels. Parameter dnmix_active signal is active (e.g., "1") if the sum of the downmix coefficients used to downmix the input channels to 2 output channels is greater than one.

Parameter operational mode indicates the Dolby® standard operating mode used to implement, among others, the dynamic range control. Standard operating modes include "RF Mode," "Line Mode," "Custom_a," and "Custom_d." Action 200 is followed by action 202.

In action 202, a final scale (represented by a mantissa and an exponent) is determined from parameters operational mode, dynrng, compre compr, dynscalelow, dynscalehigh, and dnmix_active. Final scale is the dynamic range control value that will be multiplied with the decoded audio samples (frequency samples represented by mantissas and exponents) to adjust their dynamic range. The final audio samples are computed using the following equation:

$$\text{Audio Sample} = \text{Final Scale} * \text{Decoded Audio Sample}. \quad \text{Eqn. 1}$$

Depending on the operational mode, different functions are used to determine the final scale. Table 1 illustrates how final scale is determined in pseudo code based on C language syntax.

TABLE 1

| RF Mode | Line Mode | Custom_a and Custom_d |
|---|---|---|
| Compre && compr → final scale = compr + 11 dB | dyrirng > 0 dB → final scale = dynrng * dynscalelow | Dynrng > 0 dB → final scale = dynrng * dynscalelow |
| Compre && !compr → final scale = dynrng + 11 dB | dyrrrng ≦0 dB && dnmix_active → final scale = dynrng | Dynrng ≦ 0 dB → final scale = dynrng * dynscalehigh |
| !compre && dnmix_active → final scale = dynrng − 11 dB | dynrng ≦0 dB && !dnmix_active → final scale = dynrng * dynscalehigh | Dnmix_active → final scale = dynrng − 11 dB |
| !compre && !dnmix_active → final scale = dynrng | | |

For example, in line mode, if (1) parameter dynrng is less than or equal to 0 dB and (2) parameter dnmix_active signal is not active (e.g., "0"), then the final scale is equal to the product of parameters dynrng and dynscalehigh.

In the first pass through action 202, the 2-channel final scale for the current audio block is determined from the 2-ch parameters and the common parameters. In the first pass through action 202, 2-ch dynscalehigh is used for dynscalehigh of Table 1, 2-dynscalelow is used for dynscalelow of Table 1, and 2-ch dnmix_active is used for dnmix_active of Table 1. In a second pass through action 202 (described later), the m-channel final scale is determined from parameters used only for adjusting the dynamic range of the m-channel output ("m-ch parameters") and the common parameters. Action 202 is followed by action 204.

In action 204, the final scale is modified and converted to components of mantissa and exponents. Final scale must be modified and converted from its dB format to a format that can be multiplied with the frequency samples in floating-point format to adjust the frequency samples by the dB value represented by the final scale. Action 204 is followed by action 206.

In action 206, the final scale is multiplied with the frequency samples of the current audio block to adjust the dynamic range of the block. Multiplication of two floating-point values consists of adding their exponents and multiplying their mantissas. Thus, the exponent of the final scale is added to the exponent of each frequency sample of the current audio block and the mantissa of the final scale is multiplied to the mantissa of each frequency sample of the current audio block. Each sum exponent and each product mantissa become the new exponent and the new mantissa for each corresponding frequency sample in the current audio block. Action 206 is followed by action 208.

In action 208, the binary point of each new mantissa is right shifted by the value of the its new exponent and rounded to a lower number of bits. Action 208 is followed by action 210. In action 210, the frequency samples (now consisting of the shifted mantissas) of the current audio block are inverse transformed (by, e.g., inverse modified discrete cosine transform) into an audio block of time samples. Action 210 is followed by action 212. In action 212, the current audio block of time samples is windowed and overlapped/added (collectively referred as "windowing" or "window") with the preceding audio block of time samples to reconstruct the PCM audio signals (also called "windowed time samples"). Action 212 is followed by action 214.

In action 214, the PCM audio signals generated in action 212 are stored. Action 214 is followed by action 216. In action 216, a determination is made as to whether m-channel dynamic range control has been applied to generate the m-channel output. If so, action 216 is followed by actions 220. Otherwise, action 216 is followed by action 218.

In action 218, parameters used only to adjust the dynamic range of the m-channel output ("m-ch parameters") are loaded. These parameters include parameter m-channel scale high ("m-ch dynscalehigh") (e.g., 8 bits), parameter m-channel scale low ("m-ch dynscalelow") (e.g., 8 bits), and parameter m-channel downmix active ("m-ch dnmix_active") (e.g., 1 bit). The previously loaded common parameters remain unchanged and therefore are not loaded again. Action 218 is followed by the previously described actions 202, 204, 206, 208, 210, 212, 214, and 216. In the second pass through action 202, the m-channel final scale is determined from the m-ch parameters and the common parameters. In the second pass through action 202, m-ch dynscalehigh is used for dynscalehigh of Table 1, m-dynscalelow is used for dynscalelow of Table 1, and m-ch dnmix_active is used for dnmix_active of Table 1. Subsequently, actions 204, 206, 208, 210, 212, 214 generate and store the windowed time samples generated with the m-channel final scale.

In action 220, the PCM audio signals generated with the 2-ch final scale are downmixed from the input channels to 2 output channels. Action 220 is followed by action 222. In action 222, the PCM audio signals for 2-channel output (samples generated with 2-ch final scale) are provided to a PCM output buffer for 2-channel output while the PCM audio signals for m-channel output (samples generated with m-ch final scale) are provided to a PCM output buffer for m-channel output. Action 222 is followed by action 224. In action 224, the 2-channel and m-channel PCM audio signals are output.

As described above, to provide 2-channel and m-channel outputs (m>0; e.g., m=6) with independent dynamic range control, many actions are repeated. Among the actions repeated are the inverse transform of action 210 and windowing of action 212, which are processor and/or memory intensive. Thus, a more efficient method to provide independent dynamic range control for 2-channel and m-channel outputs can be achieved if the repetition of actions 210 and 212 are avoided or replaced with alternative actions that are less processor and/or memory intensive.

In accordance with one aspect of the present invention, a method 40 (FIG. 5A) provides independent dynamic range control for 2-channel and m-channel output (m>0). Method 40 includes the previously described actions 100, 102, 104, 106, 108, 110, 112, and 114 (FIG. 1B). Action 114 is followed by action 250. In action 250, an audio decoder 304 (FIG. 2) applies dynamic range control for m-channel output (m>0) to frequency samples to generate m-channel frequency samples. Action 250 is followed by action 252. In action 252, audio decoder 304 inverse transforms the m-channel frequency samples to generate m-channel time samples (audio samples in the time domain). Action 252 is followed by action 254. In action 254, audio decoder 304 windows the time samples to generate m-channel windowed time samples (also called "m-ch PCM audio samples"). Action 254 is followed by action 256.

In action 256, audio decoder 304 applies dynamic range control for 2-channel output to m-channel windowed time samples to form 2-channel windowed time samples. Audio decoder 304 uses stepping functions to generate 2-channel scale factors that, when multiplied with groups of the m-channel windowed time samples, remove at least partially the effects of windowing and the m-channel dynamic range control applied in the frequency domain, and readjust the dynamic range of the windowed time samples for 2-channel output. Thus, a first set of windowed time samples under m-channel dynamic range control and a second set of windowed time samples under 2-channel dynamic range control are advantageously generated without repeating the inverse transform and the windowing as in method 20 (FIG. 1C). Action 256 is followed by action 260.

In action 260, audio decoder 304 downmixes the 2-channel windowed time samples to form 2-channel PCM audio samples for 2-channel output. Action 260 is followed by action 262. In action 262, audio decoder 304 stores the PCM audio samples in buffers. Action 262 is followed by action 264. In action 264, audio decoder 304 outputs the 2-channel and m-channel PCM audio samples.

In one implementation, a host device 30 (FIG. 2) includes a host processor 300, an AC-3 source 302, an audio decoder 304, a digital to analog converter ("DAC") 312, and a Sony/Philips digital interface format converter ("SPDIF") 314. Host device 30 is, for example, a conventional DVD player or a computer. AC-3 source 302 is, for example, a conventional DVD drive or a hard disk drive. AC-3 source 302 supplies AC-3 bitstreams to decoder 304. Decoder 304 generates digital audio samples from the AC-3 bitstreams in accordance to commands from host processor 300. Host processor 300 receives commands from a user through a remote 306. Host processor 300 sends commands to decoder 304 by writing to a host register 326 (FIG. 3). Host register 326 includes, for example, smaller host registers.

Decoder 304 passes a 2-channel output 308 and a m-channel output 310 to DAC 312 and/or SPDIF converter 314. DAC 312 passes analog audio samples (either 2-channel, m-channel, or both) to, for example, a stereo system 316 that accepts analog audio signal. SPDIF 314 passes formatted digital audio samples (either 2-channel, m-channel, or both) to, for example, a stereo system 318 that accepts SPDIF digital audio signal.

Decoder 304 includes a parser 320 (FIG. 3) that receives the AC-3 bitstream (action 100 from FIG. 1A) from AC-3 source 302. Parser 320 synchronizes the AC-3 bitstream and checks the AC-3 bitstream for errors (action 102). Parser 320 also parses out the BSI, the main information, and the side information (action 104). Parser 320 passes the BSI, the main information, and the side information to a datapath 322 (FIG. 3).

Datapath 322 decodes the exponents and the mantissas of the frequency samples (actions 106, 108, 110, 112, and 114 of FIG. 1A). Datapath 322 applies dynamic range control to the frequency samples (action 116). Datapath 322 inverse transforms the frequency samples to time samples and windows the time samples (actions 118 and 120). Datapath 322 passes the windowed time samples to a postprocessor 324 (FIG. 3). Datapath 322 receives commands from host processor 300 in host register 326.

Postprocessor 324 stores the windowed time samples received from datapath 322 in buffer 346 for m-channel output. Postprocessor 324 also downmixes the windowed time samples received from datapath 322 from m channels of input to 2 channels of output (action 122). Postprocessor 324 stores the downmixed windowed time samples (action 124) in buffer 344 and windowed time samples in buffer 346. Buffers 344 and 346 eventually outputs the windowed time samples and the downmixed windowed time samples to DAC 312 or SPDIF 314 (action 126).

Datapath 322 includes an input interface 328 (FIG. 4A) that receives data from parser 320 and host register 326. Input interface 328 writes these data to data memory 330 (FIG. 4A). A digital signal processor ("DSP") 332 executes a program 334 stored in program memory 336. Program 334 includes instructions that independently apply m-channel and 2-channel dynamic range control. When executing program 334, DSP 332 writes intermediate results and output data to data memory 330. Addresses of data in data memory 330 and host register 326 are mapped to a memory map unit 338. An output interface 340 writes output data to postprocessor 324.

In one implementation, action 250 (FIG. 5A) includes actions 400, 402, 403, 404, 406, 408, 410, 412, 414, 416, 418, 420, 422, 424, 426, 428, and 430 (FIG. 5B). In action 400, input interface 328 loads parameters used only to adjust the dynamic range of the 2-channel output ("2-ch parameters") from host register 326 (FIG. 4B) to their respective locations in working memory 342 (FIG. 4C) of memory 330A. The 2-ch parameters include the 2-channel scale high value ("2-ch dynscalehigh") (e.g., 8 bits), the 2-channel scale low value ("2-ch dynscalelow") (e.g., 8 bits), and the 2-channel downmix active signal ("2-ch dnmix_active") (e.g., 1 bit) from postprocessor 324. Input interface 328 loads parameter 2-ch dynscalehigh from host register 326 as parameter dynscalehigh in working memory 342, 2-channel dynscalelow host register 326 as dynscalelow in working memory 342, and 2-ch dnmix_active host register 326 as dnmix_active in working memory 342.

Parameters 2-ch dynscalehigh and 2-ch dynscalelow are used to scale the dynamic range gain word ("dynrng") to produce partial dynamic range reproduction. In one variation, a user specifies the values of parameters 2-ch dynscalehigh and 2-ch dynscalelow to host processor 300 through remote 306, and host processor 300 writes their respective values in host register 326. In another variation, host processor 300 sets default values of parameters 2-ch dynscalehigh and 2-ch dynscalelow in host register 326, and the user instructs host processor 300 to adjusts the values of parameters 2-ch dynscalehigh and 2-ch dynscalelow through remote 306.

Parameter 2-ch dnmix_active is generated by the Dolby® downmix algorithm applied. Parameter dnmix_active is active (e.g., "1") if the sum of the downmix coefficients used to downmix the input channels to the output channels is greater than one. In one variation, postprocessor 324 generates parameter 2-ch dnmix_active according to the Dolby® downmix algorithm postprocessor 324 applies to downmix windowed time samples. Postprocessor 324 writes parameter 2-ch dnmix_active to host register 326 (FIG. 4B).

Input interface 328 also loads other parameters used to adjust the dynamic range of both the 2-channel output and the m-channel output ("common parameters") in memory 330A (FIG. 4C) and maps their addresses to memory map unit 338 (FIG. 4A). The common parameters include the dynrng (e.g., 8 bits) for the current block, the compression gain word exist bit ("compre") (e.g., 1 bit) for the current frame, the compression gain word ("compr") (e.g., 8 bits) for the current frame, the operational mode (also known as "compression mode") (e.g., 2 bits), and the decoded mantissas and exponents of the current block of frequency samples (256 frequency samples total).

Operational modes are standard operating modes defined by Dolby Laboratories, Inc. to simplify the implementation of dynamic range control and other features. Operational modes include "RF Mode," "Line Mode," "Custom_a," and "Custom_d." In one variation, host processor 300 sets the default operational mode in host register 326. In this variation, the user instructs host processor 300 to change the operational mode through remote 306. Exemplary code for action 400 is shown in the Appendix from line 2 of p. 25 to line 33 of p. 25. Action 400 is followed by action 402.

In action 402, DSP 332 determines the 2-ch final scale value according to the values of dynscalehigh, dynscalelow, dnmix_active saved in working memory 342, the values of common parameters saved in memory 330A (FIG. 4C), and the conditions illustrated in the previously described Table 1. Exemplary code for action 402 is shown in the Appendix from line 19 of p. 29 to line 32 of p. 31. Action 402 is followed by action 403. In action 403, DSP 332 modifies and converts the 2-ch final scale to components of mantissa and exponents. DSP 332 must modify and convert 2-ch final scale from its dB format to a format that can be multiplied with the frequency samples in floating-point format to adjust the dynamic range of the frequency samples. Action 403 is followed by action 404.

In action 404, DSP 332 saves the 2-ch final scale of the current block in memory 330A (FIG. 4C) and maps its address in memory map unit 338 (FIG. 4A). As FIG. 4C shows, memory 330A also contains the 2-ch final scale from the previous block (described later). Exemplary codes for action 403 and 404 are shown in the Appendix from line 34 of p. 31 to line 5 of p. 32. Action 404 is followed by action 406.

In action 406, DSP 332 "steps" the 2-ch final scale of the current block with the 2-ch final scale of the previous block to form n number of scale factors (n>0). DSP 332 first shifts the binary point of the mantissas of the 2-ch final scales of the current block and the previous block by the value of their respective exponents. DSP 332 then determines the scale factors according to the following equations:

$$\text{2-ch scale factor}_1 = \text{2ch\_finalscale\_preblk} + (\text{2ch\_finalscale\_curblk} - \text{2ch\_finalscale\_preblk}) * 1/n$$

$$\text{2-ch scale factor}_2 = \text{2ch\_finalscale\_preblk} + (\text{2ch\_finalscale\_curblk} - \text{2ch\_finalscale\_preblk}) * 2/n$$

$$\text{2-ch scale factor}_{(n-1)} = \text{2ch\_finalscale\_preblk} + (\text{2ch\_finalscale\_curblk} - \text{2ch\_finalscale\_preblk}) * (n-1)/n$$

$$\text{2-ch scale factor}_n = \text{2ch\_finalscale\_preblk} + (\text{2ch\_finalscale\_curblk} - \text{2ch\_finalscale\_preblk}) * n/n \quad \text{Eqn. 2}$$

Parameter 2ch_finalscale_preblk is the 2-ch final scale of the previous block and parameter 2ch_finalscale_curblk is the 2-ch final scale of the current block. In one example, n is eight are there are eight 2-ch scale factors. Please note that 2-ch final scale of the previous block was saved by DSP 332 in memory 330A (FIG. 4C) when DSP 332 processed the previous block. If the current block is the first block of the first frame being decoded, there is no 2-ch final scale from the previous block and DSP 332 sets value of the 2-ch final scale from the previous block as 1. Action 406 is followed by action 408.

In action 408, DSP 332 saves the 2-ch scale factors in memory 330A (FIG. 4C) and maps their addresses to memory map unit 338 (FIG. 4A). In one variation, DSP 332 converts the 2-ch scale factors to mantissa and exponent format and saves the mantissas and exponents of the 2-ch scale factors in memory 330A. Exemplary codes for action 406 and 408 are shown in the Appendix from line 7 of p. 32 to line 43 of p. 32. Action 408 is followed by action 410.

In action 410, input interface 328 loads parameters used only to adjust the dynamic range of the m-channel output ("m-ch parameters") from host register 326 to their respective locations in working memory 342 (thereby replacing the 2-ch parameters). These parameters include a m-channel scale high value ("m-ch dynscalehigh") (e.g., 8 bits), a m-channel scale low value ("m-ch dynscalelow") (e.g., 8 bits), and a m-channel downmix signal ("m-ch dnmix_active") (e.g., 1 bit). Exemplary code for action 410 is shown in the Appendix from line 35 of p. 25 to line 58 of p. 25. Action 410 is followed by action 412.

In action 412, DSP 332 determines the m-ch final scale value according to the values of dynscalehigh, dynscalelow, dnmix_active saved in working memory 342, the values of common parameters saved in memory 330A (FIG. 4C), and the conditions illustrated in the previously described Table 1. Action 412 is similar to action 402. Exemplary code for action 412 is shown in the Appendix from line 19 of p. 29 to line 32 of p. 31. Action 412 is followed by action 414. In action 414, DSP 332 modifies and converts the m-ch final scale to components of mantissa and exponents. Action 414 is similar to action 404. Action 414 is followed by action 416. In action 416, DSP 332 saves the m-ch final scale of the current block in memory 330A (FIG. 4C) and maps the address to memory map unit 338 (FIG. 4A). Exemplary codes for action 414 and 416 are shown in the Appendix from line 34 of p. 31 to line 5 of p. 32. Action 416 is followed by action 418.

In action 418, DSP 332 "steps" the m-ch final scale of the current block with the m-ch final scale of the previous block to form n number of scale factors. DSP 332 first shifts the binary point of the mantissas of the m-ch final scales of the current block and the previous block by the value of their respective exponents. DSP 332 then determines the scale factors according to the following equations:

$$\text{m-ch scale factor}_1 = \text{m\_ch\_finalscale\_preblk} + (\text{m\_ch\_finalscale\_curblk} - \text{m\_ch\_finalscale\_preblk}) * 1/n$$

$$\text{m-ch scale factor}_2 = \text{m\_ch\_finalscale\_preblk} + (\text{m\_ch\_finalscale\_curblk} - \text{m\_ch\_finalscale\_preblk}) * 2/n$$

$$\text{m-ch scale factor}_{(n-1)} = \text{m\_ch\_finalscale\_preblk} + (\text{m\_ch\_finalscale\_curblk} - \text{m\_ch\_finalscale\_preblk}) * (n-1)/n$$

$$\text{m-ch scale factor}_n = \text{m\_ch\_finalscale\_preblk} + (\text{m\_ch\_finalscale\_curblk} - \text{m\_ch\_finalscale\_preblk}) * n/n \quad \text{Eqn. 3}$$

Parameter m_ch_finalscale_preblk is the m-ch final scale of the previously block and parameter m_ch_finalscale_curblk is the m-ch final scale of the current block. Please note that m-ch final scale of the previous block was saved by DSP 332 in memory 330A (FIG. 4C) when DSP 332 processed the previous block. If the current block is the first block of the first frame being decoded, there is no m-ch final scale from the previous block and DSP 332 sets the value of the m-ch final scale from the previous block as 1. Action 418 is similar to action 406. Exemplary code for action 418 is shown in the Appendix from lines 7 to 43 of p. 32. Action 418 is followed by action 420.

In action 420, DSP 332 truncates the m-ch scale factors. DSP 332, for example, truncates the m-ch scale factors from 48 bits to 24 bits. Action 420 is followed by action 422. In action 422, DSP 332 inverts the values of the m-ch scale factors. In one variation, DSP 332 uses a lookup table 348 (FIG. 4C) stored in memory 330A (FIG. 4C) to determine the inverted values of the m-ch scale factors. Alternatively, DSP 332 calculates the inverted value of the m-ch scale factors. Action 422 is followed by action 424.

In action 424, DSP 332 multiplies each inverted m-ch scale factor with the corresponding 2-ch scale factors. DSP 332 first converts the inverted m-ch scale factors to mantissa and exponent format. DSP 332 then adds the exponents of the corresponding inverted m-ch scale factor and 2-ch scale factor and multiplies the mantissas of the corresponding inverted m-ch scale factor and 2-ch scale factor. The sum exponent and product mantissa form a new exponent and a mantissa for the 2-ch scale factor. For example, exponent of m-ch scale factor, is added to exponent of 2-ch scale factor$_1$ to form the new exponent of 2-ch scale factor$_1$, and mantissa of m-ch scale factor$_1$ is multiplied to mantissa of 2-ch scale factor$_1$ to form the new mantissa of 2-ch scale factor$_1$. Action 424 is followed by action 426.

In action 426, DSP 332 saves the new 2-ch scale factors in memory 330A (FIG. 4C) and maps their address to memory map unit 338 (FIG. 4A). In one variation, DSP 332 saves the new 2-ch scale factors over the old 2-ch scale factors. Exemplary codes for action 422, 424, and 426 are shown in the Appendix from line 45 of p. 32 to line 39 of p. 35. Action 426 is followed by action 428. In action 428, DSP 332 multiplies the m-ch final scale of the current block with the frequency samples of the current block to form frequency samples for m-channel output ("m-ch frequency samples"). Action 428 is similar to action 206 (FIG. 1C). Action 428 is followed by action 430. In action 430, DSP 332 right shifts the binary point of each mantissa the m-ch frequency samples by the value of its exponent. In one variation, DSP 332 also rounds the shifted frequency samples to a smaller bit size. For example, DSP 332 rounds the shifted frequency samples from 48 bits to 24 bits. Exemplary codes for action 428 and 430 are shown in the Appendix from line 27 of p. 27 to line 17 of p. 29. Action 430 is followed by action 252.

In one implementation, action 256 includes actions 436 and 438. In action 436, DSP 332 saves the m-ch windowed time samples generated in memory 330A (FIG. 4C) and maps their addresses to memory map unit 338. In action 436, output interface 340 passes the m-ch windowed time samples and the 2-ch scale factors to postprocessor 324. Action 436 is followed by action 438.

In one variation, postprocessor 324 is similar to datapath 322. In this variation, postprocessor 324 has an input interface 628 that receives the m-ch windowed time samples from datapath 322 and saves the m-ch windowed time samples to a data memory 630. Postprocessor 324 also has a DSP 632 that executes the instructions described above and below according to a program 634 saved in a program memory 636. Postprocessor 324 further has a memory map unit 638 containing the addresses of the data in data memory 630 and an output interface 640 that outputs results to PCM buffers 344 and 346 (to be described). FIG. 4A may be modified according to Table 2 to illustrate postprocessor 324.

TABLE 2

| Reference | Modification |
|---|---|
| 330 | 630 |
| 332 | 632 |
| 334 | 634 |
| 336 | 636 |

TABLE 2-continued

| Reference | Modification |
|---|---|
| 338 | 638 |
| 340 | 640 |

In action 438, DSP 632 of postprocessor 324 multiplies the m-ch windowed time samples with the 2-ch scale factors stored in action 426 to form 2-ch windowed time samples. The 2-ch scale factors at least partially removes the effects of windowing and replaces the m-channel dynamic range control with 2-channel dynamic range control. Thus, method 40 does not repeat computational intensive actions of inverse transform and windowing like method 20.

In one variation, where there are eight 2-ch scale factors (n=8), output interface 340 of datapath 322 passes m-channel windowed time samples in groups of 32 samples to input interface 628 of postprocessor 324. DSP 632 of postprocessor 324 multiplies the first group (the first 32 samples) with the 2-ch scale factor$_1$, the second group (the next 32 samples) with the 2-ch scale factor$_2$, and so forth until 256 samples (a block of audio samples) are multiplied. Action 438 is followed by action 260.

In action 260, DSP 632 of postprocessor 324 conventionally downmixes the 2-ch windowed time samples to 2-ch PCM audio samples for 2-channel output. If the sum of the downmix coefficients used to downmix the 2-ch windowed time samples is greater than 1, DSP 632 of postprocessor 324 writes an active signal 2ch_dnmix_active (e.g., "1") in host register 326.

If DSP 632 does not downmixes the m-channel windowed time samples, DSP 632 of postprocessor 324 writes an inactive signal m_ch_dnmix_active (e.g., "0") in host register 326. However, if the m-ch windowed time samples are downmixed, DSP 632 writes an active signal mach_dnmix_active if the sum of the downmix coefficients used to downmix the m-ch time samples is greater than 1. Action 260 is similar to action 220 (FIG. 1C). Action 260 is followed by action 262.

In action 262, output interface 640 of postprocessor 324 passes the 2-ch and the m-ch PCM audio samples to respective output buffers 344 and 346. Action 262 is followed by action 264. In action 264, output buffers 344 and 346 output the 2-ch and m-ch PCM audio samples to DAC 312 and/or SPDIF 314.

Method 40 generates 2-channel and m-channel outputs without repeating the inverse transform or the windowing. However, additional actions are added to step the 2-channel and the m-channel final scales to form the 2-channel and the m-channel scale factors, to invert the m-channel scale factors, to multiply the inverted m-channel scale factors with the 2-channel scale factors to form new 2-channel scale factors, and to multiply the new 2-channel scale factors with m-channel windowed time samples to form 2-channel windowed time samples. However, the added computational and/or memory costs of these actions still provide a saving over the computational and/or memory costs of repeating the inverse transform and the windowing.

In accordance with another aspect of the present invention, a method 50 (FIG. 6A) provides independent dynamic range control for 2-channel and m-channel output. Method 50 includes the previously described actions 100, 102, 104, 106, 108, 110, 112, and 114 (FIG. 1B). Action 114 is followed by action 251. In action 251, an audio decoder 304 (FIG. 2) applies dynamic range control for m-channel output to frequency samples to generate m-channel frequency samples. Action 250 is followed by action 252. In action 252, audio decoder 304 inverse transforms the m-channel frequency samples to generate m-channel time samples. Action 252 is followed by action 258.

In action 258, audio decoder 304 applies 2-channel dynamic range control on the m-channel time samples during windowing to form 2-channel windowed time samples. Audio decoder 304 uses a 2-channel final scale that, when multiplied with time samples during windowing, remove at least partially the m-channel dynamic range control applied in the frequency domain, and readjust the dynamic range of the time samples for 2-channel output. Thus, a first set of windowed time samples under m-channel dynamic range control and a second set of windowed time samples under 2-channel dynamic range control are advantageously generated without repeating the inverse transform as in method 20 (FIG. 1C). Action 256 is followed by action 260.

In action 260, audio decoder 304 downmixes the 2-channel windowed time samples to form 2-channel PCM audio samples for 2-channel output. Action 260 is followed by action 262. In action 262, audio decoder 304 stores the PCM audio samples in buffers. Action 262 is followed by action 264. In action 264, audio decoder 304 outputs the 2-channel and m-channel PCM audio samples.

In one implementation, action 251 (FIG. 6A) includes actions 500, 502, 504, 506, 508, 510, 512, 514, 516, 518, 520, 522, and 524 (FIG. 6B). In action 500, input interface 328 loads the 2-ch parameters to working memory 342 (FIG. 4D) in memory 330B. Input interface 328 also loads the common parameters to memory 330B and maps the addresses to memory map unit 338 (FIG. 4A). Action 500 is similar to action 400. Action 500 is followed by action 502. In action 502, DSP 332 determines the 2-ch final scale. Action 502 is similar to action 402. Action 502 is followed by action 504. In action 504, DSP 332 modifies and converts the 2-ch final scale to a mantissa and an exponent. Action 504 is similar to action 404. Action 504 is followed by action 506. In action 506, DSP 332 saves the 2-ch final scale in memory 330B and maps the addresses to memory map unit 338. Action 506 is followed by action 508.

In action 508, input interface 328 loads the m-ch parameters to working memory 342 (FIG. 4D) of memory 330B and maps their addresses to memory map unit 338. Action 508 is similar to action 410. Action 508 is followed by action 510. In action 510, DSP 332 determines the m-ch final scale. Action 510 is similar to action 412. Action 510 is followed by action 512. In action 512, DSP 332 modifies and converts the m-ch final scale to a mantissa and an exponent. Action 512 is similar to action 414. Action 512 is followed by action 514. In action 514, DSP 332 stores the m-ch final scale in memory 330B and maps the address to memory map unit 338. Action 514 is similar to action 416. Action 514 is followed by action 516. In action 516, DSP 332 inverts the m-ch final scale. In one variation, DSP 332 uses a lookup table 350 (FIG. 4D) stored in memory 330B to determine the inverted values of the m-ch scale factors. Alternatively, DSP 332 calculates the inverted value of the m-ch final scale. Action 516 is followed by action 518.

In action 518, DSP 332 multiplies the 2-ch final scale with the inverted m-ch final scale to form a new 2-ch final scale. DSP first converts the inverted m-ch final scale to mantissa and exponent format. DSP 332 then adds the exponents of the 2-ch final scale and the inverted m-ch final scale and multiplies the mantissas of the 2-ch final scale and the inverted m-ch final scale. The sum exponent and product mantissa form a new exponent and a new mantissa for the 2-ch final scale. Action 518 is followed by action 520. In action 520, DSP 332 saves the new 2-ch final scale in memory 330B and maps the address to memory map unit 338. In another variation, DSP 332 saves the new 2-ch final scale over the old 2-ch final scale. Action 520 is followed by action 522.

In action 522, DSP 332 multiplies the m-ch final scale with the frequency samples of the current block to form m-channel frequency samples whose dynamic range has been compressed by the m-ch final scale. Action 522 is similar to action 428. Action 522 is followed by action 524. In action 524, DSP 332 right shifts the mantissa of each new frequency sample by the value of its exponent. In one variation, DSP 332 also rounds the shifted mantissa from 48 bits to 24 bits. Action 524 is similar to action 430. Action 524 is followed by action 252.

In action 252, DSP 332 conventionally inverse transforms (e.g., by inverse modified discrete cosine transform) the m-ch frequency samples to m-ch time samples. Action 252 is followed by action 258.

In one implementation, action 258 (FIG. 6A) includes actions 528, 530, 531, 532, and 534 (FIG. 6B). In action 528, DSP 332 saves the m-ch time samples in memory 330B (FIG. 4D) and maps the addresses to memory map unit 338 (FIG. 4A). Action 528 is followed by action 530. In action 530, DSP 332 conventionally windows and overlaps/adds the m-ch time samples of the current block with the m-ch time samples of the previous block to generate m-ch windowed time samples (also known as "m-ch PCM audio samples"). Action 530 is similar to action 434. Action 530 is followed by action 531. In action 531, DSP 332 saves the m-ch windowed time samples in memory 330B and maps the addresses to memory map unit 338. Action 531 is followed by action 532.

In action 532, DSP 332 windows and overlaps/adds (1) the m-ch time samples (stored in action 528) of the current block multiplied with the 2-ch final scale of the current block and (2) the m-ch windowed time samples of the previous block multiplied with the 2-ch final scale of the previous block as follows.

$$\text{window\_time\_sample} = (\text{time\_sample\_preblk} * 2\text{ch\_final\_scale\_preblk} * \text{window\_coeff1} + \text{time\_sample\_currblk} * 2\text{ch\_final\_scale\_currblk} * \text{window\_coeff2}) * 2 \qquad \text{Eqn. 4}$$

Parameter window_time_sample is the 2-ch windowed time sample. Parameter time_sample_currblk is the m-ch time samples of the current block and parameter 2ch_final_scale_currblk is the 2-ch final scale of the current block. Parameter time_sample_preblk is the m-ch windowed time samples from the previously block and parameter 2ch_final_scale_preblk is the 2-ch final scale from the previously block. DSP 332 generated and saved time_sample_preblk and 2ch_final_scale_preblk when it processed the previous block. Window_coeff1 and window_coeff2 are window coefficients are determined by the transform window sequence of Table 7.33 of "Digital Audio Compression (AC-3)" referenced above.

In action 532, the multiplication of the 2-ch final scale with the m-ch time samples at least partially removes the effects of the m-channel dynamic range control and readjusts the dynamic range of the m-ch time samples for 2-channel output. Thus, method 40 provides independent 2-channel and m-channel dynamic range control without repeating the computational intensive inverse transform like method 20.

In action 534, DSP 332 saves the 2-ch windowed time samples generated in action 532 in memory 330B (FIG. 4D) and maps the addresses to memory map unit 338 (FIG. 4A). In one variation, output interface 340 of datapath 322 transmits the 2-ch and m-ch windowed time samples to input interface 628 of postprocessor 324. Input interface 628 saves the 2-ch and m-ch windowed time samples in memory 630 and maps the addresses to memory map unit 638. Action 534 is followed by action 260.

In action 260, DSP 632 of postprocessor 324 conventionally downmixes the 2-ch windowed time samples to generate 2-ch PCM audio samples for 2-channels output. If the sum of the downmix coefficients used to downmix the 2-ch windowed time samples is greater than 1, DSP 632 of postprocessor 324 writes an active signal 2ch_dnmix_ active (e.g., "1") in host register 326. If DSP 632 does not downmixes the m-ch windowed time samples, DSP 632 of postprocessor 324 writes an inactive signal m_ch_dnmix_ active (e.g., "0") in host register 326. However, if the m-ch windowed time samples are downmixed, DSP 632 writes an active signal m_ch_dnmix_active if the sum of the downmix coefficients used to downmix the m-ch time samples is greater than 1. Action 260 is followed by action 262.

In action 262, output interface 624 of postprocessor 334 passes the 2-ch and the m-ch PCM audio samples to output buffers 334 and 346. Action 262 is followed by action 264. In action 264, output buffers 344 and 346 output the 2-channel and m-channel PCM audio samples to DAC 312 and SPDIF 314.

Method 50 generates 2-channel and m-channel outputs without repeating the inverse transform. However, additional actions are added to invert the m-channel final scale, to multiply the inverted m-channel final scale with the 2-channel final scale to form new 2-channel final scale, and to window the m-channel time samples multiply with the new 2-channel final scale to form the 2-channel windowed time samples. However, the added processor and/or memory costs of these actions still provide a saving over the processor and/or memory costs of repeating the inverse transform.

Numerous modifications and adaptations of the embodiments described herein will be apparent to the skilled artisan in view of the disclosure. For example, the method described above can be implemented in software for a general purpose processor instead of a DSP. While the 2-ch final scale is determined first in these methods, the m-ch final scale may be determined first. Numerous such changes and modifications are encompassed by the attached claims.

APPENDIX A

```
// start of gain calculation
    mov @channum, x                      // move channum from memory to reg
    cmp0 x                               // chk channum = 0?
    jmp dual_mono_ch1_chk, noteq         // chk if dual mono and channel 1
    mov @compmode, a0                    // mov mem_mapped reg358 to reg
    mov mcompmode, a2                    // send compmode mask to reg a2
    and a0, a2, a0                       // get compmode from reg358
    mov a0, @compmod_sav                 // sav compmod to local memory
    mov @compre, a0
    mov a0, @compre_wkg                  // sav compre to working memory
    mov @compr, a0
    mov a0, @compr_wkg                   // sav dialexp to working memory
    mov @dialexp, a0
    mova0, @dialexp_wkg
    mov @dialmant, a0
    mov a0, @dialmant_wkg
// calculate stepped gain value for 2 channel
    mov @dynscalehigh_2ch, a0
    mov a0, @dynscalehigh                // sav 2ch dynscalehigh to working reg
    mov @dynscalelow_2ch, a0
    mov a0, @dynscalelow                 // sav 2ch dynscalelow to working reg
    mov @drc_2ch_preblkch0, a0
    mov a0, @drc_preblk_wkg              // sav 2ch drc for pre-blk to working reg
    mov @dwnmx_active, a0
    asr a0, 1, a0                        // bit 1 = 2ch dwnmx_active, shift to bit0
    move a0, @dwnmx_active_wkg           // sav 2ch dwnmx_active to working reg
    jsub_compfact_calcu                  // go to compfact calcu sub-routine
    mov gain_step_2ch, p0                // specify start_addr for 8 2ch stepped gain val
                                         // also fill in delay slot mov @drc_preblk_wkg, a0
    mov a0, @drc_2ch_preblkch0           // update content of @drc_2ch_preblk
// calculate stepped gain value for 6 channel
    mov @dynscalehigh_6ch, a0
    mov a0, @dynscalehigh                // sav 6ch dynscalehigh to working reg
    mov @dynscalelow_6ch, a0
    mov a0, @dynscalelow                 // sav 6ch dynscalelow to working reg
    mov @drc_6ch_preblkch0, a0
    mov a0, @drc_preblk_wkg              // sav 6ch drc for pre-blk to working reg
    mov @dwnmx_active, a0
    mov 0x01, a2                         // mask for bit 0 = 6ch dwnmx_active
    and a2, a0, a0
    mov a0, @dwnmx_active_wkg            // sav 6ch dwnmx_active to working reg
    jsub_compfact_calcu                  // go to compfact calcu sub-routine
    mov gain_step_6ch, p0                // specify start_addr for 8 6ch stepped gain val
                                         // also fill in delay slot mov @drc_preblk_wkg, a0
    mov a0, @drc_6ch_preblkch0           // update content of @drc_6ch_preblk
    mov inv_mant_table_ptr, p2           // set pointer for inv mant table
    mov gain_step_expch0_b0, p3          // set start addr for exp portion of final scale
    mov gain_step_mantch0_b0, p4         // set start addr for mant portion of final scale
    mov @drc_buffer_cnt_ch0, a0          // select which drc buf (0 to 2) to shore
                                         // final scale exp and mant
    asl a0, 4, a2                        // offset = buffer_count * 16
    mov a2, s2
    updateptr p3, s2 || updateptr p4, s2 // read from base+offset
```

APPENDIX A

```
// update drc buffer counter and reset to 0 if reach 3
    inc a0, a0                          // advance to next buffer
    mov 3, x
    cmp x, a0                           // buffer_count = 3?
    xor a0, a0, a0, equal               // yes, set to point to buffer 0
    mov a0, @drc_buffer_cnt_ch0
// done updating drc_buffer_cnt_ch0
    mov gain_step_6ch, p0               // set start addr for 6ch stepped gain val
    jsub_inverse_6ch_drc
    mov gain_step_2ch, p1               // set pointer for 8 2ch stepped gain val
                                        // of 8 6ch stepped drc
                                        // also fill in delay slot
    jmp start_dial_norm
    nop
dual_mono_ch1 chk:
    mov 1, a0
    cmp a0, x                           // chk channum = 1?
    jmp gainrng_calcu, noteq            // no, jmp to gainrng_calcu
    nop
    mov @acmod, y                       // yes, go ahead to check
                                        // ifacmod = 0
                                        // sav acmod to reg y, fill in
                                        // delay slot
    cmp0 y                              // chk acmod = 0?
    jmp gainrng_calcu, noteq            // if no, jmp to gainrng_calcu
    nop
    mov @compr2e, a0
    mov a0, @compre_wkg                 // sav compr2e to working memory
    mov @compr2, a0
    mov a0, @compr_wkg                  // sav compr2 to working memory
    mov @dialexp2, a0
    mov a0, @dialexp_wkg                // sav dialexp2 to working memory
    mov @dialmant2, a0
    mov a0, @dialmant_wkg               // sav dialmant2 to working memory
// calculate stepped gain value for 2 channel
    mov @dynscalehigh_2ch, a0
    mov a0, @dynscalehigh               // sav 2ch dynscalehigh to working reg
    mov @dynscalelow_2ch, a0
    mov a0, @dynscalelow                // sav 2ch dynscalelow to working reg
    mov @drc_2ch_preblkch1, a0
    mov a0, @drc_preblk_wkg             // sav 2ch drc for pre-blk to working reg
    mov @dwnmx_active, a0
    asr a0, 1, a0                       // bit 1 = 2ch dwnmx_active, shift to bit0
    mov a0, @dwnmx_active_wkg           // sav 2ch dwnmx_active to working reg
    jsub_compfact_calcu                 // go to compfact calcu sub-routine
    mov gain_step_2ch, po               // specify start_addr for 8 2ch stepped gain val
                                        // also fill in delay slot
    mov @drc_preblk_wkg, a0
    mov a0, @drc_2ch_preblkch1          // update content of @drc_2ch_preblk
// calculate stepped gain value for 6 channel
    mov @dynscalehigh_6ch, a0
    mov a0, @dynscalehigh               // sav 6ch dynscalehigh to working reg
    mov @dynscalelow_6ch, a0
    mov a0, @dynscalelow                // sav 6ch dynscalelow to working reg
    mov @drc_6ch_preblkch1, a0
    mov a0, @drc_preblk_wkg             // sav 6ch drc for pre-blk to working reg
    mov @dwnmx_active, a0
    mov 0x01, a2                        // mask for bit 0 = 6ch dwnmx_active
    and a2, a0, a0
    mov a0, @dwnmx_active_wkg           // sav 6ch dwnmx_active to working reg
    jsub_compfact_calcu                 // go to compfact calcu sub-routine
    mov gain_step_6ch, p0               // specify start_addr for 8 6ch stepped gain val
                                        // also fill in delay slot
    mov @drc_preblk_wkg, a0
    mov a0, @drc_6ch_preblkch1          // update content of @drc_6ch_preblk
    mov inv_mant_table_ptr, p2          // set pointer for inv mant table
    mov gain_step_6ch, p0               // set start addr for 6ch stepped gain val
    mov gain_step_expch1_b0, p3         // set start addr for exp portion of final scale
    mov gain_step_mantch1_b0, p4        // set start addr for mant portion of final scale
    mov @drc_buffer_cnt_ch1, a0         // select which drc buf (0 to 2) to store
                                        // final scale exp and mant
    asl a0, 4, a2                       // offset = buffer_count * 16
    mov a2, s2
    updateptr p3, s2 || updateptr p4, s2  // read from base+offset
```

APPENDIX A

```
// update drc buffer counter and reset to 0 if reach 3
    inc a0, a0                          // advance to next buffer
    mov 3, x
    cmp x, a0                           // buffer_count = 3?
    xor a0, a0, a0, equal               // yes, set to point to buffer 0
    mov a0, @drc_buffer_cnt_ch1
// done updating drc_buffer_cnt_ch1
    jsub_inverse_6ch_drc
    mov gain_step_2ch, p1               // set pointer for 8 2ch stepped gain val
                                        // of 8 6ch stepped drc
                                        // also fill in delay slot
    jmp start_dial_norm
    nop
gain_calcu_done:
    jsub_out_data
    nop
//      cmp0 a1
    jmp read_new_cmd_a                  // chk nsamps = 0? yes, read new
                                        // command
    nop
/*--------------------------------------
   denorm_a
   basically, multiply sample mant with gainmant,
   subtract gainexp from sample exp,
   right shift final sample mant by final sample
   exp, and save back to memory
   pointers:
   p3: points to denormalize samples
   registers:
   a0 = sample_cnt
   x, y, a1, a2, a3: general purpose
   s1 = 1
--------------------------------------*/
denorm_a:
    mov mant_ptr, p0                    // assign mant base to p0
    mov exp_ptr, p1                     // assign exp base to p1
    .print "in denorm_a"
    mov 1, s1
    mov @rematflg, y                    // move rematflg to a reg
    cmp0 y                              // chk rematflg = 0?
    jmp rematrix_case_ptr_set1, noteq   // set different ptr for rematrix
                                        // case
    mov tc_ptr, p3                      // in normal case, assign tc_ptr
                                        // to p3
    jmp denorm_proc                     // jump to denorm process common
                                        // to normal case and rematrix case
    nop
rematrix_case_ptr_set1:
    mov @channum, y
    cmp0 y                              // chk channum = 0?
    jmp rematrix_case_ptr_set2, noteq   // in rematrix, assign different
                                        // start value for p3 for
                                        // different channum
    mov dly_ptr3, p3                    // in rematrix, when channum = 0,
                                        // assign dly_ptr3 to p3
    jmp denorm_proc
    nop
rematrix_case_ptr_set2:
    mov rmtrx_ptr, p3                   // in rematrix, when channum = 1,
                                        // assign rmtrx_ptr to p3
denorm_proc:
    mov @sample_cnt, a0
    for a0, end_of_denorm_proc_loop     // denorm process, loop sample_cnt
                                        // times
    mov @gainmant, x                    // prepare gainmant
    mov (p0)+s1, y                      // prepare sample mant
    mov @gainexp_ch, a1                 // prepare gainexp_ch
    mov (p1)+s1, a2                     // prepare sample exp
    mul   || sub a2, a1, a2             // do denorm, sav final exp to a2
    mov 0, a1
    mov 32, a3                          // maxexp is 32
    cmp a2, a3                          // chk final exp >= 32?
    jmp sav_sample_to_mem, ge           // yes, exp >= 32
    mov 24, a3                          // fill in delay slot
    cmp a2, a3                          // chk final exp > 24?
    jmp exp_le_24_case, le              // no, exp <= 24, jmp to
                                        // exp_le_24_case
```

APPENDIX A -continued

```
        sub a2, a3, a3              // fill in delay slot
        asr t, a3, a1               // when 24 < exp < 32,
                                    // do two step shifting,
                                    // because current shifter
                                    // is within −24~+24
                                    // first step:
                                    // rshift sample mant by exp-24
        asr a1, 24, a1              // second step:
                                    // rshift first step result
                                    // by 24,
        jmp sav_sample_to_mem
        round a1, a1                // fill in delay slot
exp_le_24_case:
        mov −24, a3                 // fill in delay slot
        cmp a2, a3                  // chk final exp >= −24?
        jmp exp_le_neg24_case, lt   // no, exp < −24, jmp to
                                    // exp_le_neg24_case
        mov −32, a3                 // fill in delay slot
        neg a2, a2
                                    // for −24 <= exp <= 24
case,
        ashf t, a2, a1              // shift sample mant by exp
                                    // if exp (a2) >0, ashf = asl
                                    // else, ashf = asr
                                    // this is why we neg a2 first
                                    // before do shifting
        jmp sav_sample_to_mem
        round a1, a1                // round mant before sav to
mem
                                    // also fill in delay slot
exp_le_neg24_case:
        cmp a2, a3                  // chk final exp > −32?
        jmp sav_sample_to_mem, le   // no, exp <= −32, jmp to
                                    // sav_sample_to_mem
        mov −24, a3                 // fill in delay slot
        sub a2, a3, a3
        asl t, a3, a1               // when −32 <= exp < −24,
                                    // do two step shifting,
                                    // because current shifter
                                    // is within −24~+24
                                    // first step:
                                    // lshift sample mant by exp-24
        asl a1, 24, a1              // second step:
                                    // lshift first step result
                                    // by 24,
        round a1, a1                // round mant before sav to mem
sav_sample_to_mem:
        mov a1, (p3)+s1             // save denormlized sample to (p3)
end_of_denorm_proc_loop:
        nop
        mov 256, x
        sub x, a0, a1               // get the iteration number that
                                    // want to fill zeros for samples
        for1 a1, end_fill_zero_loop
        mov 0, y
        mov y, @sample_cnt          // initialize @sample_cnt, also
                                    // fill in one delat slot
end_fill_zero_loop:
        mov y, (p3)+s1              // fill zero for samples between
                                    // sample_cnt and 256
        jsub_out_data
        nop
        jmp read_new_cmd_a
        nop
/*--------------------------------------------
 subroutine: compfact_calcu
 It calculates compfact based on downmix.c of ac3
 3.11 version reference code
 After computing compfact, it split exp and mant part
 to get gainexp and gainmant, mainly based on mants_d.c
 of ac3 3.11 version reference code:
 1. do exp, mant part spliting for compfact
 2. adjust exp, mant in case of custom_digital mode
 Note: need to negate dialmant when adjust mant part
 3. renormalize gainmant, gainexp by catching the leading
 zero of gainmant and left shift it by that number. subtract
 that number from gainexp
```

APPENDIX A

```
    4. save gainexp + 1 to @gainexp_adj for gainrng_calcu
    5. do it ONLY at the start of blk
    6. for rf case, do saturation
registers:
a1: don't use in this routine, in caller, it is nsamps
x, y, a0, a2, a3: general purpose
--------------------------------------------*/
_compfact_calcu:
    mov @compmod_sav, x                  // mov compmode to reg x
    mov comp_rf, y
    cmp x, y                             // chk compmod = RF mode ?
    jmp rf_case, equal
    mov comp_lineout, y                  // fill in delay slot
    cmp x, y
    jmp custom_case, notq
    mov @dynrng_wkg, x                   // mov dynrng_wkg to reg x
    cmp0 x                               // line_out case: chk if x > 0?
    jmp line_out_use_dynscalelow, gt     // yes, to line_out_use_dynscalelow
    mov @dwnmx_active_wkg, y             // fill in delay slot
    mov 1, a2
    cmp y, a2                            // chk if dwnmx_active = 1?
    jmp donot_use_dynscale, equal        // yes, use dynrng_wkg
    mov @dynscalehigh, a0                // no, use dynscalehigh,
sav it to a0
    jmp lout_chk_a0                      // chk dynscalehigh(dynscalelow) =
                                         // "1 1 1 1 1 1 1 1"

nop
line_out_use_dynscalelow:
    mov @dynscalelow, a0                 // use dynscalelow, sav it to a0
lout_chk_a0:
    mov 255, a2
    cmp a0, a2                           // chk a0 = 255?
    jmp donot_use_dynscale, equal        // yes, jmp to donot_use_dynscale
    nop
    cmp0 a0                              // chk a0 = 0 ?
    jmp lout_disable_dynrng, equal
    inc a0, a0                           // add 1 to
dynscalehigh/dynscalelow if
                                         // not 0 and 255, this will generate
                                         // the range from 2/256/ to 255/256
    asl a0, 15, a0                       // lshift a0 by 15, sav to
a0
    mov mdynscale, a3
    and a0, a3, a2                       // two-complement fraction representation
                                         // of dynscalehigh(dynscalelow)
                                         // original dynscalehigh(dynscalelow):
                                         // 0000000000000000A0A1A2A3A4A5A6A7
                                         // After shifting & anding:
                                         // 0.A0A1A2A3A4A5A6A7000000000000000 mov a2, y
    mul                                  // mult dynrng with dynscalehigh or
                                         // dynscalelow
    copy t, a0                           // sav scaled dynrng val to a0
    jmp start_spliting_gain_exp_mant
    nop
lout_disable_dynrng:
    jmp start_spliting_gain_exp_mant
    mov 0, a0                            // now dynrng is 0, fill in delay slot
donot_use_dynscale:
    jmp start_spliting_gain_exp_mant
    mov @dynrng_wkg, a0                  // just use original dynrng value
                                         // fill in delay slot
custom_case:
    mov @dynrng_wkg, x                   // mov dynrng_wkg to reg x
    cmp0 x                               // line_out case: chk if x > 0?
    jmp custom_use_dynscalelow, gt       // to line_out_use_dynscalelow
    mov 255, a0
    mov @dynscalehigh, a2                // no, use dynscalehigh, sav to a2
    jmp custom_chk_a2                    // chk dynscalehigh(dynscalelow) =
                                         // "1 1 1 1 1 1 1 1"

nop
custom_use_dynscalelow:
    mov @dynscalelow, a2                 // use dynscalelow, sav it to a0
```

APPENDIX A

```
custom_chk_a2:
    cmp a2 ,a0                              // chk a2 = 255?
    jmp chk_custom_dmx_active, equal        // yes, to chk_custom_dmx_active
    mov @dynrng_wkg, a0                     // when a2 = 255, sav dynrng_wkg
                                            // to a0
    cmp0 a2                                 // chk a2 = 0?
    jmp chk_custom_dmx_active, equal
    mov 0, a0                               // disable dynrng, fill in delay slot
    inc a2, a2                              // add 1 to dynscalehigh/dynscalelow if
                                            // not 0 and 255, this will generate
                                            // the range from 2/256/ to 25/256
    asl a2, 15 a2                           // lshift a2 by 15, sav to a2
    mov mdynscale, a3
    and a2, a3, a2                          // two-complement fraction representation
                                            // of dynscalehigh(dynscalelow)
                                            // original dynscalehigh(dynscalelow);
                                            // 0000000000000000A0A1A2A3A4A5A6A7
                                            // After shifting & anding:
                                            // 0.A0A1A2A3A4A5A6A70000000000000000
    mov a2, y
    mul                                     // mult dynrng with dynscalehigh or
                                            // dynscalelow
    copy t, a0                              // sav scaled dynrng val to a0
chk_custom_dmx_active:
    mov @dwnmx_active_wkg, x
    mov 1, y
    cmp x, y                                // chk if dwnmx_active = 1?
    jmp start_spliting_gain_exp_mant, noteq // no, go to
                                            // start_spliting_gain_exp_mant
    mov eleven_db, a3
    sub a0, a3, a0                          // sub 11db from compfact a0
    jmp start_spliting_gain_exp_mant
    nop
rf_case:
    mov @compre_wkg, x                      // mov compre_wkg to reg x
    cmp0 x                                  // chk if compre_wkg = 0?
    jmp chk_rf_dmx_active, equal            // yes, jmp to the routine to
                                            // chk if dwnmx_active = 1?
    mov @dwnmx_active_wkg, x                // fill in delay slot
    mov @compr_wkg, x                       // mov compr_wkg to reg x
    cmp0 x                                  // chk compr_wkg = 0?
    jmp add_11db, noteq                     // if no, use compr_wkg for adding 11db
    nop
    mov @dynrng_wkg, x                      // yes, use dynrng_wkg for adding 11db
add_11db:
    mov eleven_db, a3
    add x, a3, a0                           // add 11db with compr_wkg
                                            // (dynrng_wkg)
    jmp start_spliting_gain_exp_mant
    sat a0, a0                              // saturation, fill in delay
slot
chk_rf_dmx_active:
    mov 1, y
    cmp x, y                                // chk if dwnmx_active = 1?
    jmp donot_use_dynscale, noteq           // no, assign @dynrng_wkg to a0
    mov eleven_db, a3                       // put eleven_db to a3
                                            // fill in delay slot
    mov @dynrng_wkg, x
    sub x, a3, a0                           // sub 11db from dynrng_wkg,
    sat a0, a0                              // satuation
start_spliting_gain_exp_mant:
    mov mgainexp, a2                        // mov mgainexp to reg a2
    and a0, a2, a3                          // basically mask out the mant part
                                            // before masking:
                                            // A0A1A2A3A4A5A6A70000000000000000
                                            // after masking:
                                            // A0A1A2A300...00000000
    asr a3, 20, a3                          // rshift 20 bits of a1, sav to a3
                                            // after shifting:
                                            // A0A0A0A0A0...A0A1A2A4
    inc a3, a3                              // increment a3 by 1
    mov a3, @gainexp                        // sav gainexp to memory
```

APPENDIX A

```
        mov mgainmant1, a2              // the procedure to spliting mant is
                                        // a little bit different from
                                        // ac3 C reference code (mants_d.c)
                                        // in C code, first logic left shift out
                                        // 2 msbs, then and with 0x3fffffL
                                        // to get rid of the rest 2 msb
                                        // therefore, exp part is gone
                                        // finally, or with 0x400000L (defined
                                        // in C reference code, illustrated in
                                        // ac3 standard P.79
                                        // since in tamarin, there is no
                                        // logic left shift, what we do here
                                        // is first mask out msbyte,
                                        // then asl 2 bit
                                        // finally or with 0x400000L
        and a0, a2, a3                  // first step to get mant part
                                        // mask out msbyte of compfact
                                        // before masking, a0h contains:
                                        // A0A1A2A3A4A5A6A70000000000000000
                                        // after making:
                                        // 0000A4A5A6A70000000000000000
        asl a3, 2, a3                   // shift out 2 bit of a3(compfact)
                                        // after left shift by 2:
                                        // 00A4A5A6A7000000000000000000
        mov mgainmant2, a2
        or a3, a2, a0                   // get mant part, after "0":
                                        // 01A4A5A6A70000000000000000000
        mov a0, @gainmant               // sav gainmant to memory
// for 022 es1 drc control, calculate 8 stepped gain values
        mov @gainexp, a2
        mov @gainmant, a0
        ashf a0, a2, a0                 // sav curent gain val to a0
        asr a0, 8, a0                   // rsht a0 by 8, since we need
                                        // to sav final value to mem(24bit)
                                        // this shift guarantees no integer
                                        // on ext portion on accumulator
        mov @drc_preblk_wkg, a2         // mov drc for previous blk to a2
        neg a0, a0                      // neg cur_blk drc
        mov a0, @drc_preblk_wkg         // update previous blk drc with
                                        // negated curr blk drc.
                                        // The following stepping proc is:
                                        // curr_glk_drc + (pre_blk_drc),
                                        // where pre_blk_drc has already
                                        // been negated. The reason is that
                                        // for the first block of first frame,
                                        // we initialize pre_blk_drc to be 1.0
                                        // but since we can not sav fixed
                                        // 1. 0 to mem, we have to sav fixed
                                        // –1.0 to mem.
        neg a0, a0                      // recover curr_blk drc for stepping
// start stepping drc values
        add a0, a2, a3                  // a3 = cur_drc_val – pre_drc_val
        asr a3, 3, a3                   // a3 = (cur_drc_val – pre_drc_val)/8
        neg a2, a2
        mov 1, s1
        for 8, end_of_gain_stepping
        add a2, a3, a2                  // calcu stepped gain val
        nop
end_of_gain_stepping:
        mov a2, (p0)+s1                 // sav stepped gain val to internal mem
                                        // post_incr address
        ret
        nop
/*---------------------------------------------
  subroutine: inverse_6ch_drc
  It uses 8 stepped 6ch drc values, and calculates
  the corresponding inverse values
  1. do exp, mant part spliting for each stepped 6ch gain value
  2. get 8 msb mant portion by masking out rest of bits
  3. right shift the 8 bit mant by 16 to a generate a index for
```

APPENDIX A

```
table-lookup
    4. table look-up to get the corresponding inverse value
    5. mult 2ch stepped gain value with corresponding 6ch inverse gain value
    6. get exp & mant portion of final scale value
    p0: start address for calculated 6ch stepped gain val in final scale
    p1: start address for calculated 2ch stepped gain val in final scale
       calculation
    p2: pointer to inverse mant table
    p3: start address for final scale value exp portion
    p4: start address for final scale value mant portion
    registers:
    a1: don't use in this routine, in caller, it is nsamps
    x, y, a0, a2, a3: general purpose
    --------------------------------------------*/
_inverse_6ch_drc:
    mov 1, s1
    for 8, end_of_inverse_proc
    mov (p0)+s1, a0                    // stepped 6ch gain val
    asl a0, 8, a0                      // shift back by 8
    exp a0, a2                         // a2 has exp portion
    ashf a0, a2, a0                    // set the mask
    mov 0xff0000, a3
    and a0, a3, a0                     // now only 8 msb of a0 remained
    lsr a0, 16, a0                     // a0 is index for table look-up
                                       // Note: p2 points the content of zero
                                       // Since a0 normallycan not be 0, (then inv is infinite).
                                       // in error case, we still define gain mant to be 0
    mov (p2+a0), a3                    // a3 has inverse mant val from table-lookup
start_inv_exp_calcu:                   // x contains inv_exp, a0 contains index
    mov 191, y
    cmp a0, y                          // chk index > 191?
    jmp inv_exp_gt_191, gt             // jmp to index > 191 case
    nop                                // fill in the delay slot
// now index <= 191
inv_exp_lt_65:
    mov 65, y
    cmp a0, y                          // chk index < 65?
    jmp inv_exp_lt_33, lt              // jmp to checking index < 33 case
    mov 1, x                           // inv_exp = 1, fill in the delay slot
    jmp end_inv_exp_calcu
    nop
inv_exp_lt_33:
    mov 33, y
    cmp a0, y                          // chk index < 33?
    jmp inv_exp_lt_17, lt              // jmp to checking index < 17 case
    mov 2, x                           // inv_exp = 2, fill in the delay slot
    jmp end_inv_exp_calcu
    nop
inv_exp_lt_17:
    mov 17, y
    cmp a0, y                          // chk index < 17?
    jmp inv_exp_lt_9, lt               // jmp to checking index < 17 case
    mov 3, x                           // inv_exp = 3, fill in the delay slot
    jmp end_inv_exp_calcu
    nop
inv_exp_lt_9:
    mov 9, y
    cmp a0, y                          // chk index < 9?
    jmp inv_exp_lt_5, lt               // jmp to checking index < 5 case
    mov 4, x                           // inv_exp = 4, fill in the delay slot
    jmp end_inv_exp_calcu
    nop
inv_exp_lt_5:
    mov 5, y
    cmp a0, y                          // chk index < 5?
    jmp inv_exp_lt_3, lt               // jmp to checking index < 3 case
    mov 5, x                           // inv_exp = 5, fill in the delay slot
    jmp end_inv_exp_calcu
    nop
inv_exp_lt_3:
    mov 3, y
    cmp a0, y                          // chk index < 3?
    jmp inv_exp_lt_2, lt               // jmp to checking index < 2 case
    mov 6, x                           // inv_exp = 6, fill in the delay slot
    jmp end_inv_exp_calcu
    nop
```

APPENDIX A

```
inv_exp_lt_2:
    mov 2, y
    cmp a0, y                       // chk index < 2?
    jmp inv_exp_lt_1, lt            // jmp to checking index < 1 case
    mov 7,                          // inv_exp = 7, fill in the delay slot
    jmp end_inv_exp_calcu
    nop
inv_exp_lt_1:
    mov 1, y
    cmp a0, y                       // chk index < 1?
    jmp inv_exp_lt_0, lt            // jmp to checking index < 0 case
    mov 8, x                        // inv_exp = 8, fill in the delay slot
    jmp end_inv_exp_calcu
    nop
inv_exp_lt_0:
    jmp end_inv_exp_calcu
    mov 0, x                        // inv_exp = 0, fill in the delay slot
//now index > 191
inv_exp_gt_191:
    mov 223, y
    cmp a0, y                       // chk index > 223?
    jmp inv_exp_gt_223, gt          // jmp to index > 223 case
    mov 2, x                        // inv_exp = 2, fill in the delay slot
    jmp end_inv_exp_calcu
    nop
inv_exp_gt_223:
    mov 239, y
    cmp a0, y                       // chk index > 239?
    jmp inv_exp_gt_239, gt          // jmp to index > 239 case
    mov 3, x                        // inv_exp = 3, fill in the delay slot
    jmp end_inv_exp_calcu
    nop
inv_exp_gt_239:
    mov 247, y
    cmp a0, y                       // chk index > 247?
    jmp inv_exp_gt_247, gt          // jmp to index > 247 case
    mov 4, x                        // inv_exp = 4, fill in the delay slot
    jmp end_inv_exp_calcu
    nop
inv_exp_gt_247:
    mov 251, y
    cmp a0, y                       // chk index > 251?
    jmp inv_exp_gt_251, gt          // jmp to index > 251 case
    mov 5, x                        // inv_exp = 5, fill in the delay slot
    jmp end_inv_exp_calcu
    nop
inv_exp_gt_251:
    mov 253, y
    cmp a0, y                       // chk index > 253?
    jmp inv_exp_gt_253, gt          // jmp to index > 253 case
    mov 6, x                        // inv_exp = 6, fill in the delay slot
    jmp end_inv_exp_calcu
    nop
    jmp end_inv_exp_calcu
    nop
inv_exp_gt_253:
    mov 254, y
    cmp a0, y                       // chk index > 254?
    jmp inv_exp_gt_254, gt          // jmp to index > 254 case
    mov 7, x                        // inv_exp = 7, fill in the delay slot
    jmp end_inv_exp_calcu
    nop
inv_exp_gt_254:
    mov 8, x
end_inv_exp_calcu:
    add x, a2, a2                   // inv_exp - gain_exp, sav to a2
                                    // when use exp command to get
                                    // exp portion in tamasim, if
                                    // ori val > 1, exp is negative,
                                    // else, exp is positive
    mov a3, x
    mov (p1)+s1, a0                 // mov stepped 2xh gain val to a0
    asl a0, 8, a0                   // shift back by 8
    exp a0, a3                      // exp portion of stepped 2ch gain
    ashf a0, a3, a0                 // mant portion of stepped 2ch gain
    mov a0, y
    mul
```

-continued

APPENDIX A

```
        sub a2, a3, a2                    // when use exp command to get
                                          // exp portion in tamasim, if
                                          // ori val > 1, exp is negative,
                                          // else, exp is positive
                                          // so we basically + (−a3) = −a3
        exp t, a3
        ashf t, a3, a0                    // a0 has mant portion of final gain
        sub a2, a3, a2                    // a2 has exp portion of final gain
                                          // when use exp command to get
                                          // exp portion in tamasim, if
                                          // ori val > 1, exp is negative,
                                          // else, exp is positive
                                          // so we basically + (−a3) = −a3
        mov a2, (p3)+s1                   // sav final exp to memory
end_of_inverse_proc:
        mov a0, (p4)+s1                   // sav final mant to memory
        ret
        nop
start_dial_norm:
        mov @gainexp, a2                  // mov gainexp to reg a2
        mov comp_custom_a, y              // mov imm comp_custom_a to reg y
        mov @compmod_sav, x
        cmp x, y                          // chk if CUSTOM ANALOG mode
        jmp donot_apply_dialnorm, equal
        nop
        mov @dialexp_wkg, y               // starting dialog
normalization:
                                          // mov dialexp_wkg to reg y
        add a2, y, a3                     // add dialexp_wkg with gainexp
        mov a3, @gainexp                  // sav final gainexp to mem
        mov @dialmant_wkg, y
                                          // mov dialmant_wkg to reg y
        mov @gainmant, x                  // mov gainmant to x
        cir a2                            // set a2 = 0
        mul                               // mult gainmant with
                                          // dialmant_wkg, set a2 to 0
        subr a2, t, a2                    // negate the product, rounding
                                          // the result, sav to a2
        mov a2, @gainmant                 // save gainmant to memory
donot_apply_dialnorm:
                                          // starting renormalization:
        mov @gainmant, a0                 // mov gainmant to reg a0,
        mov @gainexp, x                   // mov gainexp to reg x
        exp a0, a3                        // get leading zeros of gainmant
        asl a0, a3, a0                    // left shift out leading zeros,
                                          // gainmant gets better precision, sav to a0
/*
        asl a0, a2, a0                    // for new version tamasim:
                                          // exp instruction sav the result
                                          // to high portion of reg
*/
        sub x, a3, a2                     modify gainexp
        mov a0, @gainmant                 // sav final gainmant to memory
        mov a2, @gainexp                  // sav gainexp to memory
        mov 0x400000, x                   // mov 0.5 to reg x
        cmp x, a0                         // chk if gainmant = 0.5?
        jmp get_gainexp_adj_ready, noteq
        nop
        dec a2, a2                        // a2 = a2−1
get_gainexp_adj_ready:
        mov a2, @gainexp_adj              // sav adjusted gainexp to memory, also
```

What is claimed is:

1. A method for controlling the dynamic range of audio samples, comprising:
   determining a first dynamic range final scale;
   determining a second dynamic range final scale;
   determining a first set of scale factors from the first dynamic range final scale and the second dynamic range final scale;
   multiplying frequency samples with the second dynamic range final scale to form multiplied frequency samples;
   inverse transforming the multiplied frequency samples to form time samples;
   windowing the time samples to form windowed samples;
   multiplying the windowed samples with the first set of scale factors to form multiplied windowed samples and thereby at least partially removing effects of the windowing and the multiplication of the second dynamic range final scale; and
   downmixing the multiplied windowed samples from the channels of input to the channels of output to form downmixed windowed samples.

2. The method of claim 1, wherein the determining the first set of scale factors comprises:

stepping the first dynamic range final scale, wherein the stepping of the first dynamic range final scale comprises determining a second set of dynamic range scale factors as follows:

2-ch scale factor$_1$=2ch_finalscale_preblk+(2ch_finalscale_curblk−2ch_finalscale_preblk)*1/n;

2-ch scale factor$_2$=2ch_finalscale_preblk+(2ch_finalscale_curblk−2ch_finalscale_preblk)*2/n;

2-ch scale factor$_{(n-1)}$=2ch_finalscale_preblk+(2ch_finalscale_curblk−2ch_finalscale_preblk)*(n−1)/n;

2-ch scale factor$_n$=2ch_finalscale_preblk+(2ch_finalscale_curblk−2ch_finalscale_preblk)*n/n;

wherein 2ch_finalscale_preblk is the first dynamic range final scale of the previous block and parameter 2ch_finalscale_curblk is the first dynamic range final scale of the current block;

stepping the second dynamic range final scale, wherein the stepping of the second dynamic range final scale comprises determining a third set of scale factors as follows:

m-ch scale factor$_1$=m_ch_finalscale_preblk+(m_ch_finalscale_curblk−m_ch_finalscale_preblk)*1/n;

m-ch scale factor$_2$=m_ch_finalscale_preblk+(m_ch_finalscale_curblk−m_ch_finalscale_preblk)*2/n;

m-ch scale factor$_{(n-1)}$=m_ch_finalscale_preblk+(m_ch_finalscale_curblk−m_ch_finalscale_preblk)*(n−1)/n;

m-ch scale factor$_n$=m_ch_finalscale_preblk+(m_ch_finalscale_curblk−m_ch_finalscale_preblk)*n/n;

wherein m_ch_finalscale_preblk is the second dynamic range final scale of the previous block and m_ch_finalscale_curblk is the second dynamic range final scale o f the current block;

inverting the third set of scale factors; and respectively multiplying the inverted third set of scale factors with the second set of scale factors to form the first set of scale factors.

3. The method of claim 2, further comprising setting the m_ch_finalscale_preblk or the 2ch finalscale_preblk to 1 if there is no m_ch_finalscale_preblk or 2ch_finalscale_preblk.

4. The method of claim 2, further comprising rounding the first set of scale factors.

5. The method of claim 2, further comprising truncating the third set of scale factors.

6. The method of claim 1, wherein the multiplying the windowed time samples with the first set of scale factors comprises:

dividing the windowed samples into n groups; and multiplying each group with the corresponding scale factor from the first set of scale factors.

7. The method of claim 1, further comprising outputting the windowed samples.

8. The method of claim 1, further comprising outputting the downmixed windowed samples.

9. A method for controlling the dynamic range of audio samples, comprising:

applying a first dynamic range control to a frequency sample to form a m-channel frequency sample;

inverse transforming the m-channel frequency sample to a m-channel time sample;

windowing the m-channel time sample to a m-channel windowed sample; and applying a second dynamic range control to the m-channel windowed time sample to form a 2-channel windowed sample.

10. The method of claim 9, further comprising downmixing the 2-channel windowed sample to form a 2-channel downmixed sample.

11. The method of 10, further comprising outputting the 2-channel downmixed sample.

12. The method of claim 9, wherein the applying the first dynamic range control comprises:

determining a first dynamic range final scale (m-ch final scale); and multiplying the frequency sample with the first dynamic range final scale.

13. The method of claim 12, wherein the applying the second dynamic range control comprises:

determining a second dynamic range final scale;

determining a scale factor from the first dynamic range final scale and the second dynamic range final scale; and multiplying the m-channel windowed sample with the scale factor thereby at least partially removing effects of the windowing and the multiplication of the first dynamic range final scale.

14. The method of claim 13, wherein the determining the scale factor comprises:

stepping the first dynamic range final scale, wherein the stepping the first dynamic range final scale comprises determining a first set of scale factors as follows:

m-ch scale factor$_1$=m_ch_finalscale_preblk+(m_ch_finalscale_curblk−m_ch_finalscale_preblk)*1/n;

m-ch scale factor$_2$=m_ch_finalscale_preblk+(m_ch_finalscale_curblk−m_ch_finalscale_preblk)*2/n;

m-ch scale factor$_{(n-1)}$=m_ch_finalscale_preblk+(m_ch_finalscale_curblk−m_ch_finalscale_preblk)*(n−1)/n;

m-ch scale factor$_n$=m_ch_finalscale_preblk+(m_ch_finalscale_curblk−m_ch_finalscale_preblk)*n/n;

wherein m_ch_finalscale_preblk is the first dynamic range final scale of the previous block and m_ch_finalscale_curblk is the first dynamic range final scale of the current block;

inverting the first set of scale factors;

stepping the second dynamic range final scale, wherein stepping the second dynamic range final scale comprises determining a second set of dynamic range scale factors as follows:

2-ch scale factor$_1$=2ch_finalscale_preblk+(2ch_finalscale_curblk−2ch_finalscale_preblk)*1/n;

2-ch scale factor$_2$=2ch_finalscale_preblk+(2ch_finalscale_curblk−2ch_finalscale_preblk)*2/n;

2-ch scale factor$_{(n-1)}$=2ch_finalscale_preblk+(2ch_finalscale_curblk−2ch_finalscale_preblk)*(n−1)/n;

2-ch scale factor$_n$=2ch_finalscale_preblk+(2ch_finalscale_curblk−2ch_finalscale_preblk)*n/n;

wherein 2ch_finalscale_preblk is the second dynamic range final scale of the previous block and 2ch_finalscale_curblk is the second dynamic range final scale of the current block;

multiplying the inverted first set of scale factors with the second set of scale factors to form a third set of scale factors; and wherein the third set of scale factors include the scale factor.

15. The method of claim 14, further comprising setting the m_ch_finalscale_preblk or the 2ch_finalscale_preblk to 1 if there is no m_ch_finalscale_preblk or 2ch_finalscale_preblk.

16. The method of claim 14, further comprising rounding the first set of scale factors.

17. The method of claim 14, further comprising truncating the third set of scale factors.

18. A computer-readable medium carrying a program for controlling the dynamic range of audio samples comprising:
- a first instruction to determine a first dynamic range final scale;
- a second instruction to determine a second dynamic range final scale;
- a third instruction to determine a first set of scale factors from the first dynamic range final scale and the second dynamic range final scale;
- a fourth instruction to multiply frequency samples with the second dynamic range final scale to form multiplied frequency samples;
- a fifth instruction to inverse transform the multiplied frequency samples to form time samples;
- a sixth instruction to window the inverse transformed frequency samples to form windowed samples;
- a seventh instruction to multiply the windowed samples with the first set of scale factors to form multiplied windowed samples and thereby at least partially removing effects of the windowing and the multiplication of the second dynamic range final scale; and
- an eighth instruction to downmix the multiplied windowed samples from the channels of input to the channels of output to form downmixed windowed samples.

19. The medium of claim 18, wherein the third instruction comprises:
- a ninth instruction to step the first dynamic range final scale, wherein the stepping of the first dynamic range final scale comprises determining a second set of scale factors as follows:

$$\text{2-ch scale factor}_1 = \text{2ch\_finalscale\_preblk} + (\text{2ch\_finalscale\_curblk} - \text{2ch\_finalscale\_preblk}) * 1/n;$$

$$\text{2-ch scale factor}_2 = \text{2ch\_finalscale\_preblk} + (\text{2ch\_finalscale\_curblk} - \text{2ch\_finalscale\_preblk}) * 2/n;$$

$$\text{2-ch scale factor}_{(n-1)} = \text{2ch\_finalscale\_preblk} + (\text{2ch\_finalscale\_curblk} - \text{2ch\_finalscale\_preblk}) * (n-1)/n;$$

$$\text{2-ch scale factor}_n = \text{2ch\_finalscale\_preblk} + (\text{2ch\_finalscale\_curblk} - \text{2ch\_finalscale\_preblk}) * n/n;$$

wherein 2ch_finalscale_preblk is the first dynamic range final scale of the previous block and 2ch_finalscale_curblk is the first dynamic range final scale of the current block;

- a tenth instruction to step the second dynamic range final scale, wherein the stepping of the second dynamic range final scale comprises determining a third set of scale factors as follows:

$$\text{m-ch scale factor}_1 = \text{m\_ch\_finalscale\_preblk} + (\text{m\_ch\_finalscale\_curblk} - \text{m\_ch\_finalscale\_preblk}) * 1/n;$$

$$\text{m-ch scale factor}_2 = \text{m\_ch\_finalscale\_preblk} + (\text{m\_ch\_finalscale\_curblk} - \text{m\_ch\_finalscale\_preblk}) * 2/n;$$

$$\text{m-ch scale factor}_{(n-1)} = \text{m\_ch\_finalscale\_preblk} + (\text{m\_ch\_finalscale\_curblk} - \text{m\_ch\_finalscale\_preblk}) * (n-1)/n;$$

$$\text{m-ch scale factor}_n = \text{m\_ch\_finalscale\_preblk} + (\text{m\_ch\_finalscale\_curblk} - \text{m\_ch\_finalscale\_preblk}) * n/n;$$

wherein m_ch_finalscale_preblk is the second dynamic range final scale of the previous block and m_ch_finalscale_curblk is the second dynamic range final scale of the current block;

- an eleventh instruction to invert the third set of scale factors; and
- a twelfth instruction to multiply the inverted third set of scale factors with the second set of scale factors to form the first set of scale factors.

20. The medium of claim 19, further comprising a thirteenth instruction to set the m_ch_finalscale_preblk or the 2ch_finalscale_preblk to 1 if there is no m_ch_finalscale_preblk or 2ch_finalscale_preblk.

21. The medium of claim 19, further comprising a thirteenth instruction to round the first set of scale factors.

22. The medium of claim 19, further comprising a fourteenth instruction to truncate the third set of scale factors.

23. The medium of claim 18, wherein the seventh instruction comprises:
- a ninth instruction to divide the windowed time samples into n groups; and
- a tenth instruction to multiply each group with the corresponding scale factor from the first set of scale factors.

24. The medium of claim 18, further comprising a ninth instruction to output the windowed samples.

25. The medium of claim 18, further comprising a ninth instruction to output the downmixed windowed samples.

26. A computer-readable medium carrying a program for controlling the dynamic range of audio samples comprising:
- a first instruction to apply a first dynamic range control to a frequency sample to form a m-channel frequency sample;
- a second instruction to inverse transform the m-channel frequency sample to a m-channel time sample;
- a third instruction to window the m-channel time sample to a m-channel windowed sample; and
- a fourth instruction to apply a second dynamic range control to the a m-channel windowed time sample to form a 2-channel windowed sample.

27. The medium of claim 26, further comprising a fifth instruction to downmix the 2-channel windowed sample after the fourth instruction to form a 2-channel downmixed sample.

28. The medium of 27, further comprising a sixth instruction to output the 2-channel downmixed sample.

29. The medium of claim 26, wherein the first instruction comprises:
- a fifth instruction to determine a first dynamic range final scale; and
- a sixth instruction to multiply the frequency sample with the first dynamic range final scale.

30. The medium of claim 29, wherein the fourth instruction comprises:
- a seventh instruction to determine a second dynamic range final scale;
- an eighth instruction to determine a scale factor from the first dynamic range final scale and the second dynamic range final scale; and
- a ninth instruction to multiply the m-channel windowed sample with the scale factor thereby at least partially removing effects of the windowing and the multiplication of the first dynamic range final scale.

31. The medium of claim 30, wherein the eighth instruction comprises:
- a tenth instruction to step the first dynamic range final scale, wherein the stepping the first dynamic range final scale comprises determining a first set of scale factors as follows:

$$\text{m-ch scale factor}_1 = \text{m\_ch\_finalscale\_preblk} + (\text{m\_ch\_finalscale\_curblk} - \text{m\_ch\_finalscale\_preblk}) * 1/n;$$

$$\text{m-ch scale factor}_2 = \text{m\_ch\_finalscale\_preblk} + (\text{m\_ch\_finalscale\_curblk} - \text{m\_ch\_finalscale\_preblk}) * 2/n;$$

$$\text{m-ch scale factor}_{(n-1)} = \text{m\_ch\_finalscale\_preblk} + (\text{m\_ch\_finalscale\_curblk} - \text{m\_ch\_finalscale\_preblk}) * (n-1)/n;$$

$$\text{m-ch scale factor}_n = \text{m\_ch\_finalscale\_preblk} + (\text{m\_ch\_finalscale\_curblk} - \text{m\_ch\_finalscale\_preblk}) * n/n;$$

wherein m_ch_finalscale_preblk is the first dynamic range final scale of the previous block and m_ch_finalscale_curblk is the first dynamic range final scale of the current block;
- an eleventh instruction to invert the first set of scale factors;
- a twelfth instruction to step the second dynamic range final scale, wherein stepping the second dynamic range final scale comprises determining a second set of dynamic range scale factors as follows:

$$\text{2-ch scale factor}_1 = \text{2ch\_finalscale\_preblk} + (\text{2ch\_finalscale\_curblk} - \text{2ch\_finalscale\_preblk}) * 1/n;$$

$$\text{2-ch scale factor}_2 = \text{2ch\_finalscale\_preblk} + (\text{2ch\_finalscale\_curblk} - \text{2ch\_finalscale\_preblk}) * 2/n;$$

$$\text{2-ch scale factor}_{(n-1)} = \text{2ch\_finalscale\_preblk} + (\text{2ch\_finalscale\_curblk} - \text{2ch\_finalscale\_preblk}) * (n-1)/n;$$

$$\text{2-ch scale factor}_n = \text{2ch\_finalscale\_preblk} + (\text{2ch\_finalscale\_curblk} - \text{2ch\_finalscale\_preblk}) * n/n;$$

wherein 2ch_finalscale_preblk is the second dynamic range final scale of the previous block and 2ch_finalscale_curblk is the second dynamic range final scale of the current block;
- a thirteenth instruction to multiply the inverted first set of scale factors with the second set of scale factors to form a third set of scale factors; and
- wherein the third set of scale factors include the scale factor.

32. The medium of claim 31, further comprising a fourteenth instruction to set the m_ch_finalscale_preblk or the 2ch_finalscale_preblk to 1 if there is no m_ch_finalscale_preblk or 2ch_finalscale_preblk.

33. The medium of claim 31, further comprising a fourteenth instruction to round the first set of scale factors.

34. The medium of claim 31, further comprising a fourteenth instruction to truncate the third set of scale factors.

* * * * *